US 8,266,372 B2

(12) United States Patent
Gillingham et al.

(10) Patent No.: US 8,266,372 B2
(45) Date of Patent: *Sep. 11, 2012

(54) HIGH BANDWIDTH MEMORY INTERFACE

(75) Inventors: Peter Gillingham, Kanata (CA); Bruce Millar, Stittsville (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 11/906,756

(22) Filed: Oct. 3, 2007

(65) Prior Publication Data
US 2008/0065820 A1    Mar. 13, 2008

Related U.S. Application Data

(63) Continuation of application No. 10/919,491, filed on Aug. 17, 2004, now Pat. No. 7,299,330, which is a continuation of application No. 10/247,821, filed on Sep. 20, 2002, now Pat. No. 6,779,097, which is a continuation of application No. 09/182,494, filed on Oct. 30, 1998, now Pat. No. 6,510,503.

(51) Int. Cl.
*G06F 12/00*    (2006.01)
(52) U.S. Cl. .................. 711/105; 711/104; 711/5
(58) Field of Classification Search .................... None
See application file for complete search history.

(56) References Cited

U.S. PATENT DOCUMENTS

| 4,389,715 A | 6/1983 | Eaton, Jr. et al. |
| 5,243,703 A | 9/1993 | Farmwald et al. |
| 5,306,965 A | 4/1994 | Asprey |
| 5,319,755 A | 6/1994 | Farmwald et al. |
| 5,355,391 A | 10/1994 | Horowitz et al. |
| 5,361,341 A | 11/1994 | Sourgen et al. |
| 5,467,455 A | 11/1995 | Gay et al. |
| 5,489,538 A | 2/1996 | Rostoker et al. |
| 5,590,086 A | 12/1996 | Park et al. |
| 5,627,481 A | 5/1997 | Takekuma et al. |
| 5,768,624 A | 6/1998 | Ghosh |
| 5,809,263 A | 9/1998 | Farmwald et al. |
| 5,821,767 A | 10/1998 | Osaka et al. |
| 5,829,026 A | 10/1998 | Leung et al. |
| 5,844,858 A | 12/1998 | Kyung |
| 5,926,837 A | 7/1999 | Watanabe et al. |
| 6,097,208 A | 8/2000 | Okajima et al. |

(Continued)

FOREIGN PATENT DOCUMENTS

JP    8-293778 A    5/1996

(Continued)

OTHER PUBLICATIONS

"Direct Rambus Technology: The New Main Memory Standard", IEEE Micro, Nov./Dec. 1997, p. 18-28.

(Continued)

*Primary Examiner* — Than Nguyen
(74) *Attorney, Agent, or Firm* — Shin Hung; Borden Ladner Gervais LLP

(57) ABSTRACT

A DRAM system configured for high bandwidth communication, the system includes at least one DRAM having resistive termination devices within the DRAM, and a controller connected to the DRAM through a data bus. The controller includes resistive termination devices and the data bus includes at least one clock line driven intermittently. The data bus provides write data from the controller to the DRAM, and provides read data from the DRAM to the controller.

43 Claims, 20 Drawing Sheets

U.S. PATENT DOCUMENTS

| | | | |
|---|---|---|---|
| 6,108,758 | A | 8/2000 | Liu |
| 6,142,830 | A * | 11/2000 | Loeffler .................. 439/620.24 |
| 6,184,737 | B1 | 2/2001 | Taguchi |
| 6,292,903 | B1 | 9/2001 | Coteus et al. |
| 6,324,120 | B2 * | 11/2001 | Farmwald et al. ....... 365/233.12 |
| 6,330,650 | B1 | 12/2001 | Toda et al. |
| 6,442,644 | B1 | 8/2002 | Gustavson |
| 6,487,648 | B1 | 11/2002 | Hassoun |
| 6,510,492 | B2 | 1/2003 | Hsu et al. |
| 6,510,503 | B2 | 1/2003 | Gillingham et al. |
| 6,519,688 | B1 | 2/2003 | Lu et al. |
| 6,772,268 | B1 | 8/2004 | Kristiansen et al. |
| 6,779,097 | B2 | 8/2004 | Gillingham et al. |
| 2008/0120458 | A1 * | 5/2008 | Gillingham et al. .......... 711/105 |

FOREIGN PATENT DOCUMENTS

JP    9-106671    4/1997

OTHER PUBLICATIONS

"Direct Rambus Technology Disclosure", Oct. 15, 1997.

Kushiyama, N., et al., "A 500 Megabyte/s Datarate 4.5M DRAM", IEEE JSSC vol. 28, No. 12, p. 490-498, Dec. 1993.

Gillingham, P., Vogley, W., "SLDRAM: High-Performance, Open Standard Memory", IEEE Micro, Nov./Dec. 1997, p. 29-39.

"Stub Series Terminated Logic for 3.3 Volts (SSTL_3)", EIA/JEDEC Standard No. 8-8, pp. 1-14, Aug. 1996.

Morooka et al., "Sources Synchronization and Timing Vernier Techniques for 1.2 GB/s SLDRAM Interface", IEEE, Feb. 6, 1998.

Kushiyama et al., "A 500-Megabyte/s Data-Rate 4.5 M DRAM", IEEE Journal of Solid-State Circuits, vol. 28, No. 4, Apr. 1993, pp. 490-498.

Gillingham, "SLDRAM Architectural and Functional Overview", SLDRAM Consortium, Aug. 29, 1997, pp. 1-14.

Takagi et al., "Recent Japanese Developments in Printed Wiring Boards for SMT", IEEE Electrical Insulation Magazine, vol. 7, No. 2, pp. 9-27, Mar./Apr. 1991.

Chung, D., "Overview of Materials for Electronic Packaging", Butterworth-Heinemann, pp. 3-4, Apr. 19, 1995.

* cited by examiner

SOURCE SYNCHRONOUS BUS TIMING

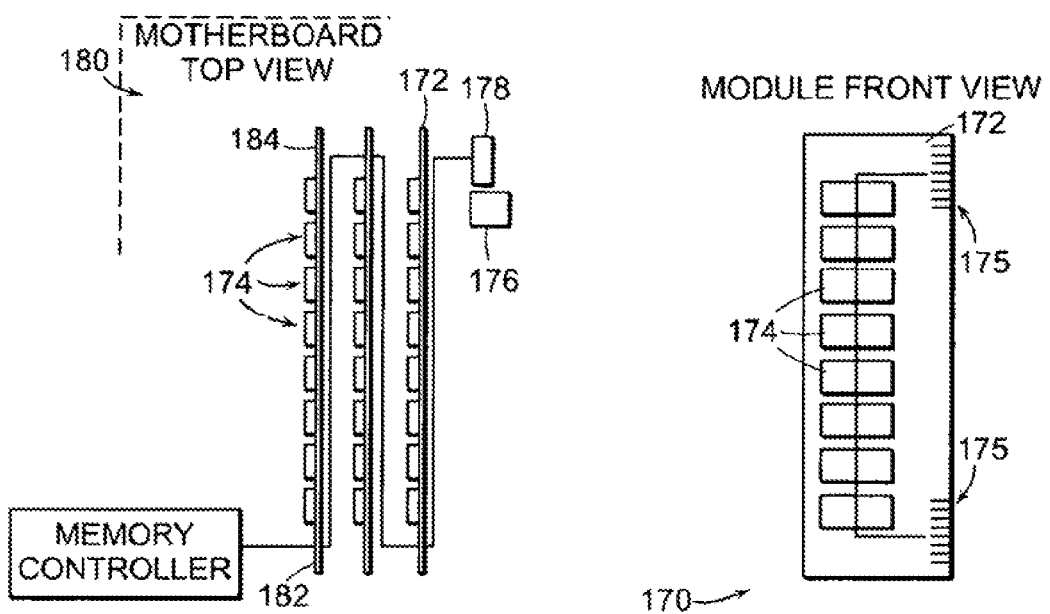
FIG. 13a (PRIOR ART)
FIG. 13b (PRIOR ART)
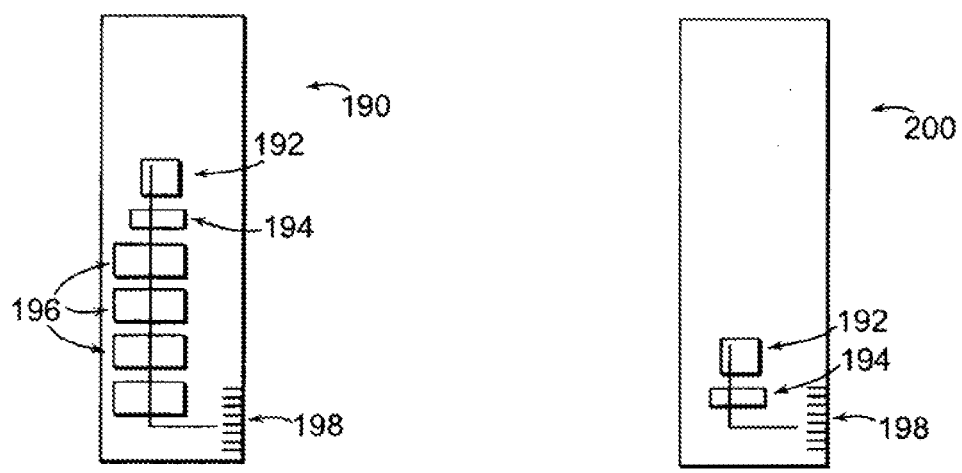
FIG. 14a
FIG. 14b

HIGH BANDWIDTH MEMORY INTERFACE

RELATED APPLICATION(S)

This application is a Continuation of U.S. application Ser. No. 10/919,491, filed Aug. 17, 2004, now U.S. Pat. No. 7,299,330 issued Nov. 11, 2007 which is a Continuation of U.S. application Ser. No. 10/247,821, filed Sep. 20, 2002, now U.S. Pat. No. 6,779,097, issued Aug. 17, 2004, which is a Continuation of U.S. application Ser. No. 09/182,494, filed Oct. 30, 1998, now U.S. Pat. No. 6,510,503, issued Jan. 21, 2003, which claims priority under 35 U.S.C. §119 or 365 to Canadian Application No. 2,243,892, filed Jul. 27, 1998. The entire teachings of the above applications are incorporated herein by reference.

BACKGROUND OF THE INVENTION

The evolution of the dynamic random access memories used in computer systems has been driven by ever-increasing speed requirements mainly dictated by the microprocessor industry. Dynamic random access memories (DRAMs) have generally been the predominant memories used for computers due to their optimized storage capabilities. This large storage capability comes with the price of slower access time and the requirement for more complicated interaction between memories and microprocessors/microcontrollers than in the case of say static random access memories (SRAMs) or non-volatile memories.

In an attempt to address this speed deficiency, various major improvements have been implemented in DRAM design, all of which are well documented. DRAM designs evolved from Fast Page Mode (FPM) DRAM to Extended Data Out (EDO) DRAMS to synchronous DRAMs (SDRAMs). Further speed increases have been achieved with Double Data Rate (DDR) SDRAM, which synchronizes data transfers on both clock edges. However, as the speed requirements from the microprocessor industry continue to move ahead, new types of memory interfaces have had to be contemplated to address the still existing vast discrepancy in speed between the DRAMs and microprocessors.

Recently, a number of novel memory interface solutions aimed at addressing the speed discrepancy between memory and microprocessors have been presented.

Several generations of high bandwidth DRAM-type memory devices have been introduced. Of note is Rambus Inc which first introduced a memory subsystem in which data and command/control information is multiplexed on a single bus and described in U.S. Pat. No. 5,319,755 which issued Jun. 7, 1994. Subsequently, Concurrent Rambus™ was introduced which altered the command/data timing but retained the same basic bus topology. Finally, Direct Rambus™ described in R. Crisp "Direct Rambus Technology: The New Main Memory Standard", IEEE Micro, November/December 1997, p. 18-28, was introduced in which command and address information is separated from data information to improve bus utilization. Separate row and column command fields are provided to allow independent control of memory bank activation, deactivation, refresh, data read and data write (column) commands. All three Rambus variations however share the same bus topology as illustrated in FIG. 1(a).

In this topology a controller 10 is located at one end of a shared bus 12, while a clock driver circuit 14 and bus terminations 16 are located at an opposite end. The shared bus includes, data and address/control busses, which run from the controller at one end to the various memory devices MEMORY I . . . MEMORY N and the termination at the far end. The clock signal generated by the clock driver 14 begins at the far end and travels towards the controller 10 and then loops back to the termination at the far end. The clock bus is twice as long as the data and address/control busses. Each memory device has two clock inputs ClkFromController and ClkToController respectively, one for the clock traveling towards the controller CTC, and another for the clock traveling away from the controller CFC towards the termination. When the controller 10 reads from a memory device, the memory device synchronizes the data it drives onto the bus with the clock traveling towards the controller. When the controller is writing to a memory device, the memory device uses the clock traveling away from the controller to latch in data. In this way the data travels in the same direction as the clock, and clock-to-data skew is reduced. The memory devices employ onchip phase locked loops (PLL) or delay locked loops (DLL) to generate the correct clock phases to drive data output buffers and to sample the data and command/address input buffers.

There are a number of shortcoming with this topology as will be described below.

For the bus topology of FIG. 1(a) the clock frequency is 400 MHz. FIG. 1(b) shows the timing of control and data bursts on the bus 12. Since data is transmitted or received on both edges of the clock, the effective data rate is 800 Mb/s. A row command ROW burst consists of eight (8) consecutive words, beginning on a falling edge of the clock from the controller CFC and applied on the three (3) bit row bus. A column command COL consists of eight (8) consecutive words transmitted on the five (5) bit column bus. Independent row and column commands can be issued to the same or different memory devices by specifying appropriate device identifiers within the respective commands. At the controller 10 the phases of the two clock inputs, CFC and CTC, are close together. There is a delay to the memory chip receiving the commands due to finite bus propagation time, shown in FIG. 1 as approximately 1.5 bit intervals or 1.875 ns. The clock signal cFc propagates with the ROW and COL., commands to maintain phase at the memory inputs. Read data resulting from a previous COL command is output as a burst of eight (8) consecutive 16 or 18 bit words on the data bus, starting on a falling edge of CTC. The data packet takes roughly the same amount of time to propagate back to the controller, about 1.5 bit intervals. The controller spaces COL command packets to avoid collisions on the databus. Memory devices are programmed to respond to commands with fixed latency. A WRITE burst is driven to the databus two bit intervals after the end of the READ burst. Because of the finite bus propagation time, the spacing between READ and WRITE bursts is enlarged at the memory inputs. Likewise, the spacing between a WRITE and READ burst would be smaller at the memory device than at the controller.

For example, there is a summation of clock-to-data timing errors in transferring data from one device to another. FIG. 2(a) is a schematic diagram of the loop-back clock, data lines and clock synchronization circuit configuration. In this configuration, the bus clock driver 14 at one end of the ClockTo-Controller line 22 of the clock bus propagates an early bus clock signal in one direction along the bus, for example from the clock 14 to the controller 10. The same clock signal then is passed through the direct connection shown to a second line 24 of the bus and loops back, as a late ClockFromController, along the bus where it terminates with resistance $R_{term}$. Thus, each memory device 26 receives the two bus clock signals at a different time. The memory device 26 includes a clock and data synchronization circuit for sampling the two bus clocks CFC and CTC and generating its own internal transmit and receive clocks TX_clk and RX_clk respectively, for clocking transmit and receive data to and from the databus respectively. The bus clock signals CFC and CTC are fed via respective input receiver comparators 11 and 20 into corresponding PLL/DLL circuits 40 and 50. For the input of data from the controller to a memory device, the role of the on-chip PLL/DLL circuit 40 is to derive from the CFC clock input, internal clocks to sample control, address, and data to be written to the memory on (positive 90° and negative 270°) edges of the clock, at the optimum point in the data eye. These internal receive data clocks may also be used to drive the internal DRAM core 32. For the output of data from the memory device 26 to the controller 10, the role of the on-chip PLL/DLL circuit 50 is to derive from the CTC clock input internal transmit data clocks (0° and 180°) to align transmitted data (read data from the memory core) with the edges of the external clock.

The data I/O pin has an output transistor 27 for driving the data bus. An actual memory device will have 16 or 18 such data pins. The other data pins are not shown in FIG. 2 (a) for simplicity. During times when the device is not driving read data onto the databus the gate of output transistor 27 is held at logic 0 by OE being logic 0, so as not to interfere with write data or read data from another device which may appear on the bus.

Row control and column control input pins are also shown in FIG. 2 (a) and it is understood that address signals are also received via the data bus. They have a structure identical to the data I/O pin, except that the gate of the output transistor 27' is tied to logic 0, since output drive is never required. The disabled output transistor 27' matches the capacitive load presented to the external bus to that of a data I/O pin, so that signal propagation characteristics are identical for all inputs. address row control, column control, and data. The two clock inputs have similar dummy output transistors 28 and 29, to equalize loading.

In the prior art system, Vterm is equal to 1.8 v, $R_{term}$ is 20Ω, and the current Iout provided by the device driving the bus is 40 mA. This is shown schematically in FIG. 2 (b). In this configuration, a high level signal is equal to the bus termination voltage, Vterm (1.8 v) and a low level signal is equal to Vterm=Iout*Rterm (1.0 v). Power consumed while the signal is pulled low is 72 mW, of which 40 mW is dissipated on chip, and 32 mW in the termination. Assuming an equal probability of high and low data, the average power dissipation would be 36 mW, of which 20 mW is dissipated on chip and 16 mW in the termination.

Given the high and. low voltage range, the reference voltage for the comparator is set to 1.4 v, which is midway between high and low levels on the bus. The input timing waveforms for this circuit configuration is shown in FIG. 3. The cFc signal is delayed from the pin through the input comparator 11. The rising edges of the clock cFc signal are shown as a shaded area 134 on the timing diagram because of the differences between the generation of rising and falling edges. Falling edges are more accurate since they are generated by on chip drivers and are calibrated to produce the desired low level signal on the bus. On the other hand, the rising edges are created by the bus termination pullup resistor and will have different edge characteristics depending on the distance from the termination, number of loads on the bus, etc. Because of the: differences in rising and falling edges, the received clock and data signals may not have precise 50/50 duty cycles. The DLL/PLL block 40 responds only to the falling edge of the clock input, since it is the most accurate edge. The DLL/PLL generates four outputs at 0°, 90°, 180° and 270°. These outputs are phase locked ta the data input. The DLL/PLL shifts the free running clock input to align the 0° and 180° outputs to input data edge transitions. The 90° and 270° outputs can then be used to sample input data in odd and even latches corresponding to data generated on rising and falling edges of the clock respectively.

There will be some timing error $\Delta r$ and $\Delta f$, on the rising edge and falling edges of DLL outputs respectively, with respect to the output of the clock comparator, as shown in FIG. 3. These timing errors may occur due to any one or a combination of static phase offset, timing jitter and wander resulting from inaccuracies and mismatches within the components making up the DLL/PLL loop. The 0° and 180° outputs will be aligned to the average transition points. Since the DLL/PLL outputs a 50/50 duty cycle signal, while the data inputs may have a degraded duty cycle due to the aforementioned asymmetrical drive problem, this results in a further error in positioning the clock for optimal data sampling. The timing errors between clock and data created at the transmitting device and the receiving device are cumulative and can result in data errors.

The output timing waveforms for the circuit of FIG. 2 (a) are shown in FIG. 4. The DLL/PLL 50 shown in FIG. 2 (a) takes the free running ClockToController and creates delayed versions of the free running clock. The DLL/PLL monitors transmit data (read data from the core memory) output to the databus via output driver transistor 27 through comparator 30 and adjusts the delay of the 0° and 180° clocks which drive the output latches 51 to align output data transitions to transitions of the ClockToController transmit clock. Due to the asymmetrical nature of the rising and falling edges appearing on the ClockToController bus, all outputs from the DLL/PLL 50 are generated from falling edges of the free running input ClockToController clock. The output data latching function is shown conceptually to include odd and even data latches and a multiplexer which alternates between the two data streams. The output data latch is followed by an AND gate which performs an output disable function, holding the gate of output driver transistor 27 at logic zero when data is not being read from the device. Similarly to the input data case, timing errors between clock and data are cumulative and can result in data errors.

Another shortcoming of the prior art implementation shown in FIG. 1(a) is the system's method for dealing with intersymbol interference. Data transitions do not always occur in the same position relative to clock edges due to a number of factors. The clock is a repetitive waveform with which there will be a constant delay from one rising edge to another or from one falling edge to another. Data transitions are dependent on the previous bits transmitted, particularly on a long bus whose propagation delay exceeds one bit period. This effect is known as intersymbol interference (ISI). The effect of different data histories creates data transitions at different times relative to the clock. Basing the input sampling time purely on a fixed phase of the input clock, as in the architecture of FIG. 1(a), will be suboptimal in the presence of ISI. Other effects such as crosstalk coupling between other wires near the signal in question, which can be either in phase or out of phase, and data dependent power supply coupling affecting both input buffers and output drivers, can also close the effective data eye, i.e., the window during which data can be successfully sampled.

A further shortcoming of the prior art is that open drain outputs, shown schematically in FIG. 2(b) are used to drive signals from a device onto the bus in the system of FIG. 1(a). Because the falling edge of the clock is created by a clock generator pull-down transistor (not shown), while the rising edge is created by the bus termination resistor, it is difficult to match pulse rise time and pulse fall time. This can lead to non-symmetric duty cycle on the clock bus. To resolve this problem, the clock falling edge can be used as a timing reference and the clock rising edge can be resynthesized internally with the DLL/PLL. However, this approach creates an internal sampling instant that is unrelated to the data edge of the bit being sampled, compounding the effects described above and resulting in further closure of the data eye, since subsequent data bits cannot be known in advance whereas a clock sequence is repetitive and therefore, determinable in advance.

Each device discussed above in the prior art self-calibrates its output pulse amplitude levels. Either an external reference or an internally generated reference level is required, along with precision comparator circuits and calibration control circuitry. Inaccuracies in any of these elements may lead the output amplitudes from different devices to vary, resulting in further closure of the data eye.

The number of devices in a the prior art configuration described above is limited to 32 because of the loading and length of the bus. With 64M devices the total memory capacity is limited to 256 MB. If a larger memory configuration is required the controller must support several busses in parallel, consuming additional pins, silicon area, and power. The packaging technology for the prior art implementation described above is called Chip Scale Packaging or uBGA (micro Ball Grid Array). The intent of this packaging technology is to minimize the stub length from the connection to the bus to the on-chip input and output buffers. The length of the stub on the module is virtually eliminated by routing the bus through the module. Although stub length is reduced compared to standard packaging and module technology, there is still as much as 5 mm of stub within the uBGA package itself. This stub can cause reflections on the bus to the detriment of signal integrity.

Another shortcoming of the prior art approach is the requirement for a separate clock generator chip. Furthermore, there is twice as much load on the clock as on any other signal, and the clock line is twice as long. Ultimately, the maximum frequency at which the system can operate will be limited by the doubly loaded clock line. The pulse symbols in FIG. 5 show how systematic skew can develop between clock and write data at the far end of the bus. The clock reaching the controller cTc has already been attenuated by traveling the full length from the clock generator to the controller, and most of the higher order harmonics have been removed. At this point, cTc and cFc clocks should be identical and the controller synchronizes transitions of write data with zero crossings of the filtered cFc clock. The write data appears on the bus at this point with sharp edges and unattenuated amplitude. Because of the different frequency composition of the clock and write data, there is different group delay between clock and data at the far end of the bus. Since the cFc clock is somewhat attenuated already, further attenuation will not significantly affect its zero crossings. On the other hand, the write data, when attenuated, will lose its higher order harmonics which create the square wave form, resulting in a wave form as shown where the zero crossings have been significantly shifted. Therefore, transitions between clock and write data at the far end are skewed by an amount shown as $t_{skew}$. As a result, write data sampling will not occur at the correct time.

Thus it may be seen that the prior art configuration described suffers from various disadvantages. The present invention seeks to mitigate at least some of these disadvantages.

SUMMARY OF THE INVENTION

Accordingly, one object of the present invention is to provide an improved high bandwidth chip-to-chip interface for memory devices, which is capable of operating at higher speeds, while maintaining error free data transmission, consuming lower power, and supporting more load.

Another object of the invention is to eliminate the requirement for a separate clock generator chip.

A further object of the invention is to provide a clock adjustment scheme to compensate for intersymbol interference, crosstalk, noise, and voltage and temperature drift in memory devices.

A still further object is to provide an improved bus topology in which clocks travel the same distance as data and do not limit overall bus performance.

A still even further object is to provide an improved packaging for these devices.

A still yet even further object is to provide a means to expand the number of memory devices that can be supported by a single controller.

In accordance with this invention, there is provided a memory subsystem comprising
  a) at least two semiconductor devices;
  b) a main bus containing a plurality of bus lines for carrying substantially all data and command information needed by the devices, the semiconductor devices including at least one memory device connected in parallel to the bus; the bus lines including respective row command lines and column command lines;
  c) a clock generator for coupling to a clock line, the devices including clock inputs for coupling to the clock line; and the devices including programmable delay elements coupled to the clock inputs to delay the clock edges for setting an input data sampling time of the memory device.

According to a further aspect of the invention there is provided
  a) a core memory;
  b) a plurality of terminal for coupling to a .bus including a free running clock and a data clock terminal and data I/O terminals;
  c) a source synchronous clock generator for synchronising the output data clock with the output data in response to the free running clock.

According to one aspect of the invention the semiconductor devices include a clock offset fine adjustment for optimizing the sampling of received data, wherein the adjustment can be set during power up and periodically during operation by the controller to compensate for temperature and voltage drift.

A further aspect of the invention provides a memory subsystem including synchronous data clocks for source synchronous clocking, while the loopback clock is used to provide a free running clock to transmit data and to time the start of bursts to position consecutive data bursts appropriately in order to avoid overlap between consecutive bursts.

A further aspect of the invention provides a memory subsystem including means for calibrating the clock offset fine adjustment by utilizing a power up synchronization sequence. Preferably, the synchronization sequence is a bit sequence that includes a number of bit patterns such as a psuedorandom pattern to evaluate substantially all meaningful intersymbol interference histories in order to set an optimum time for a sampling instant.

A further aspect of the invention provides a memory subsystem loopback clock architecture including a push pull I/O.

This allows both rising and falling edges to be used for sampling data, thereby reducing the sensitivity of the system to clock duty cycle variation. This approach also saves power in the device itself allowing more cost-effective packaging.

A further aspect of the invention provides a memory subsystem wherein the semiconductor device includes a controller, which in turn includes means for calibrating the output high/output low voltage levels Voh/Vol of the memory devices by writing to registers in the memories to increment or decrement output levels and comparing the result on the bus to a reference voltage level local to the controller.

A further aspect of the invention provides a memory subsystem wherein a repeater appears as a single load on the main bus but drives a set of signals identically to the controller to create a sub-bus on which memory devices can be connected. The repeater acts as a controller on this sub-bus and memory devices cannot distinguish between the main bus and the sub-bus and therefore, operate identically or; either one. The increased latency of devices on the sub-bus compared to those connected directly to the main bus may be corrected by the controller by scheduling activity appropriately.

A still further aspect of the invention provides a memory subsystem, wherein the semiconductor devices include series stub resistors wherein the main bus is routed through the device to mitigate the effects of the stubs. Furthermore conventional TSOP type packaging is used for lower cost.

In accordance with a further aspect of this invention, there is provided a memory subsystem comprising at least two semiconductor devices; a main bus containing a plurality of bus lines for carrying substantially all address, data and control information needed by the devices, the semiconductor devices including at least one memory device connected in parallel to the bus; where read and write data are accompanied by echo clocks, and burst placement is performed via vernier adjustment under control of the controller.

BRIEF DESCRIPTION OF THE DRAWINGS

Embodiments of the invention will now be described by way of example only with reference to the accompanying drawings in which:

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 13(a) and (b) are schematic diagrams of a memory module according to the prior art;

FIG. 14(a) is a schematic diagram of a termination module according to the embodiment of the invention;

FIG. 14(b) is a schematic diagram of a termination module according to a further embodiment of the present invention;

DETAILED DESCRIPTION OF THE INVENTION

A description of example embodiments of the invention follows.

Figure 1A:
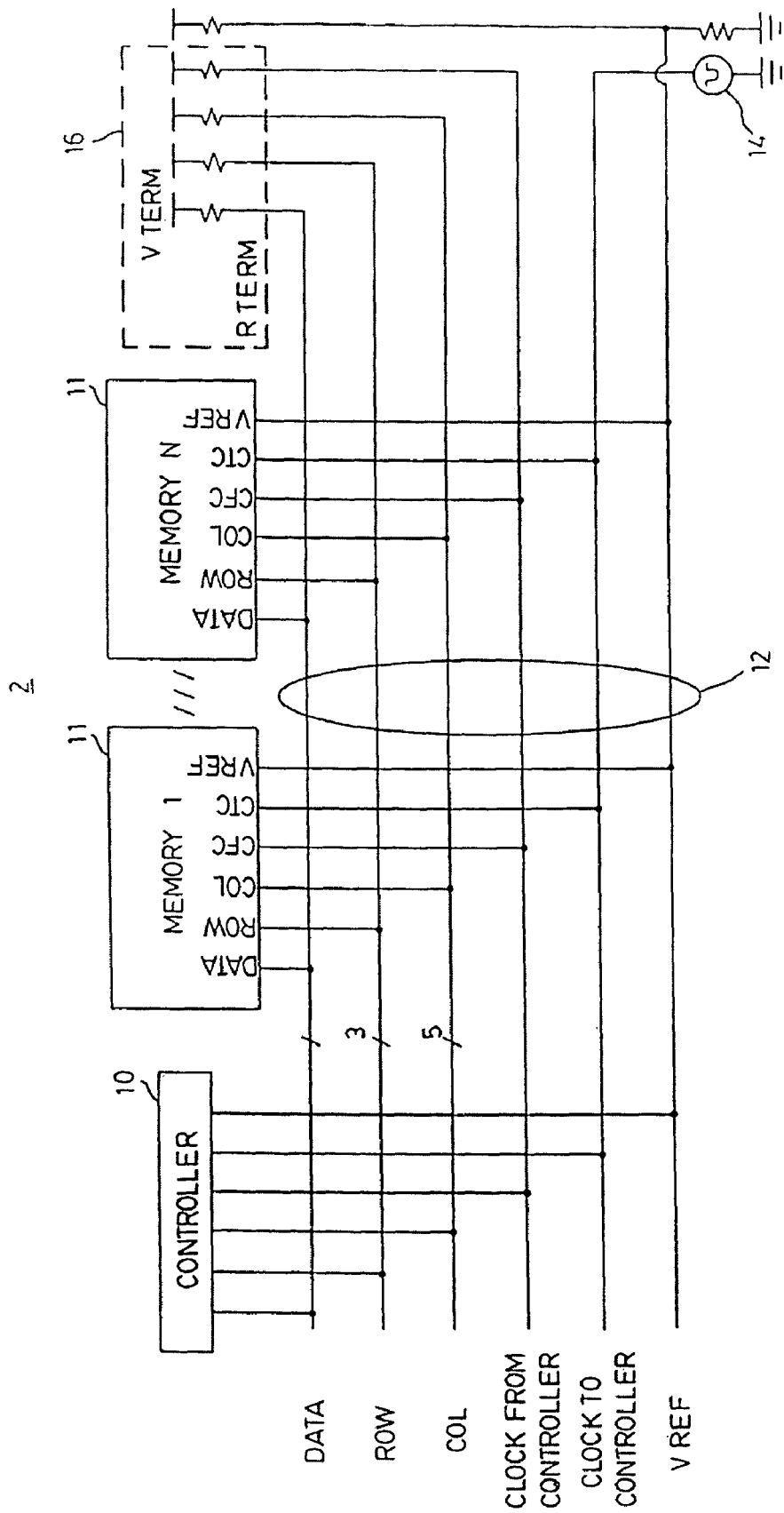
FIG. 1(a) is a schematic diagram of a bus topology according to the prior art.

Referring to FIG. 1(a) a general prior art architecture on which the present memory subsystem is based is indicated by numeral 2 and is described in greater detail in R. Crisp "Direct Rambus Technology: The New Main Memory Standard", IEEE Micro, November/December 1997, p. 18-28, incorporated herein by reference. The memory subsystem 2 includes a main bus or channel 12 which consists of a plurality of high speed controlled impedance matched transmission lines, a controller 10 and at least one memory device 11 connected thereto in parallel. The channel 12 has a bus topology with the controller 4A) at one end, terminators 16 at the other end and memory devices 11 in-between. The transmission lines include a ClockToController line; a ClockFromController line; a data bus; a row bus and column bus each carrying correspondingly named signals. These signals are terminated at their characteristic impedance $R_{term}$ at the far end of the channel.

The terminators pull the signals up to the system supplied $V_{term}$ voltage, which corresponds to logic 0. The semiconductor devices (controller and memory) assert a logic 1 by sinking current from the wire, using an open-drain NMOS transistor. The logic levels are generated about a reference voltage $V_{ref}$ set by a resistive divider as shown in FIG. 1(a). As shown $V_{ref}$ connects to each device.

In the embodiment of FIG. 1(a), the clock source is shown as a separate generator 14, however it can be integrated into the memory controller. The clock loop consists of first and second lines connected at one end. As shown, the clock loop begins at the clock generator end of the channel and propagates to the controller end as ClockToController, where it loops back at the connection between the first and second lines as ClockFromController to the memory devices and terminates. Improvements in the above architecture, which constitute embodiments of the present invention are now described below.

Figure 6A:
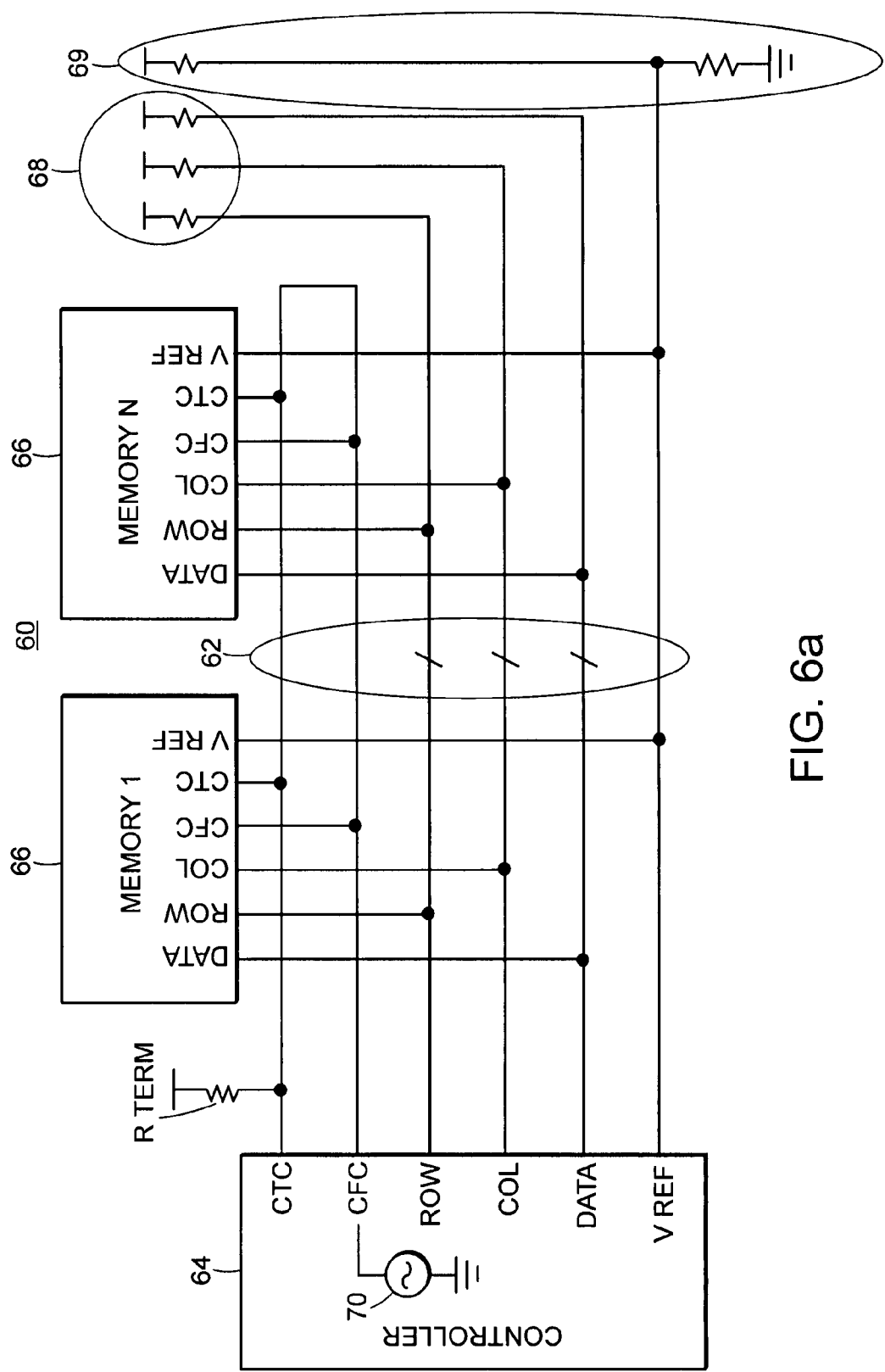
FIG. 6(a) is a schematic diagram of a bus topology implementing a synchronous clock scheme according to a first embodiment of the present invention.

Referring to FIG. 6(a) a memory subsystem for implementing "controller source synchronous clocking" according to an embodiment of the present invention is shown generally by numeral 60. The memory subsystem 60 includes a main bus or channel 62 which consists of a plurality of high speed controlled impedance matched transmission lines, a controller 64 and at least one memory device 66 connected thereto in parallel. The channel 62 has a bus topology with the controller 10 at one end, terminators 68 at the other end and memory devices 66 in-between. The transmission lines include a ClockToController line cTc; a ClockFromController line cFc; a data bus; a row bus; column bus and a Vref line each carrying correspondingly named signals. These signals are terminated at their characteristic impedance $R_{term}$ at the end of the channel 68. The reference voltage $v_{ref}$ set by a resistive divider 69. Each device connected to the bus has correspondingly named terminals.

The terminators 68 pull the signals up to the system supplied $V_{term}$ voltage, which corresponds to logic 0. The semiconductor devices (controller and memory) assert a logic 1 by sinking current from the wire, using an open-drain NMOS transistor. The logic levels are generated about the reference voltage $V_{ref}$. As shown $V_{ref}$ connects to each device.

The controller includes a clock generator 70 for generating the free running clock signal which is driven on to the bus from the cFc pin. The clock line cFc loops around at the far end 68 and returns as the cTc line. The cTc line re-enters the controller to clock in read data from the memory devices 66. The termination resistor $R_{cterm}$ for the looparound clock is located, near the controller 64. Each of the output pins of the controller have push-pull drivers. The clock output driver circuit (not shown) is matched to the row command, column command, and write data output drivers. Any temperature or voltage supply variations affecting the command or data output drivers will affect the clock output equally. Because clock and data are produced by identical drive circuits in the controller 64, and both signals propagate over similar busses, some of the skew problems associated with the loop-around clock shown in FIG. 1(a) are overcome. The controller does not have to implement a PLL/DLL aligning circuit to align control and data bursts originating from the controller to the cFc clock. This technique for matching clock and data is known as "source synchronous clocking". The clock line cFc loops around at the far end and returns as the cTc line. The cTc line re-enters the controller to clock in read data from the memory devices 66. The termination resistor $R_{cterm}$ for the looparound clock is located, near the controller 64.

Figure 1B:
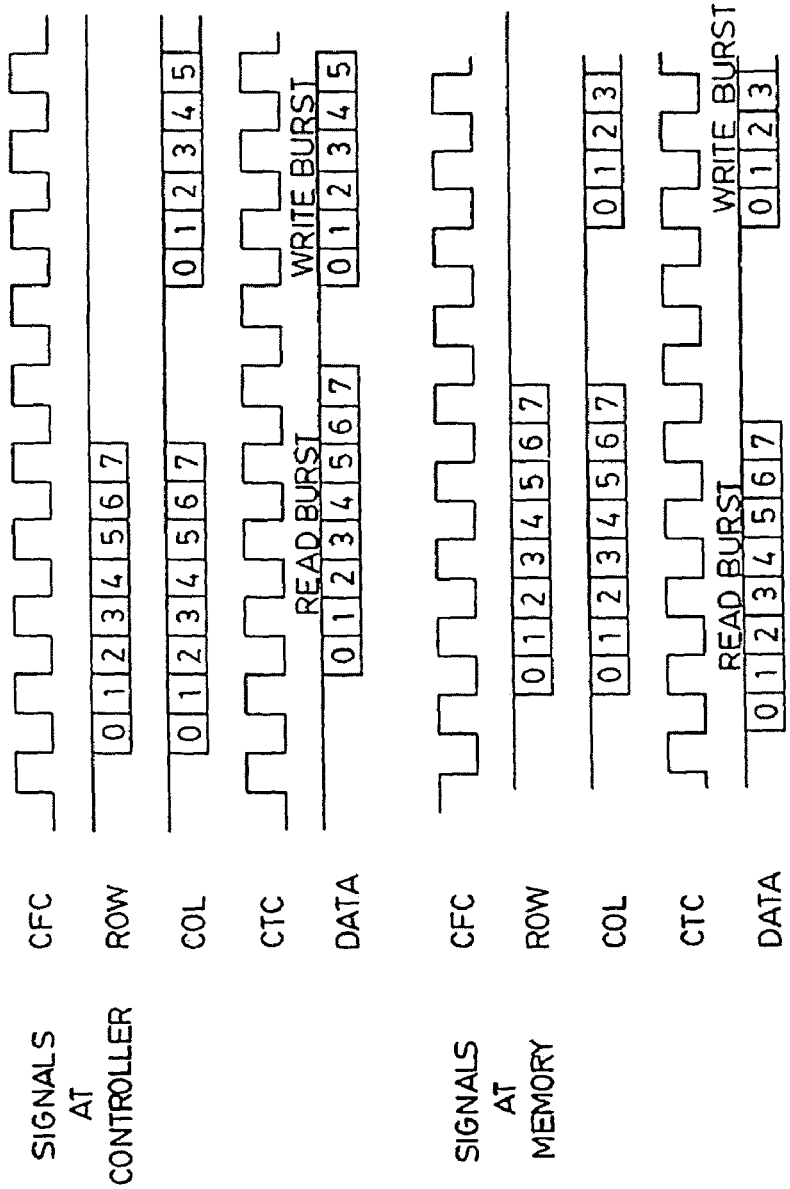
FIG. 1(b) is a schematic diagram showing packet timing for the architecture of FIG. 1(a)
Figure 2A:
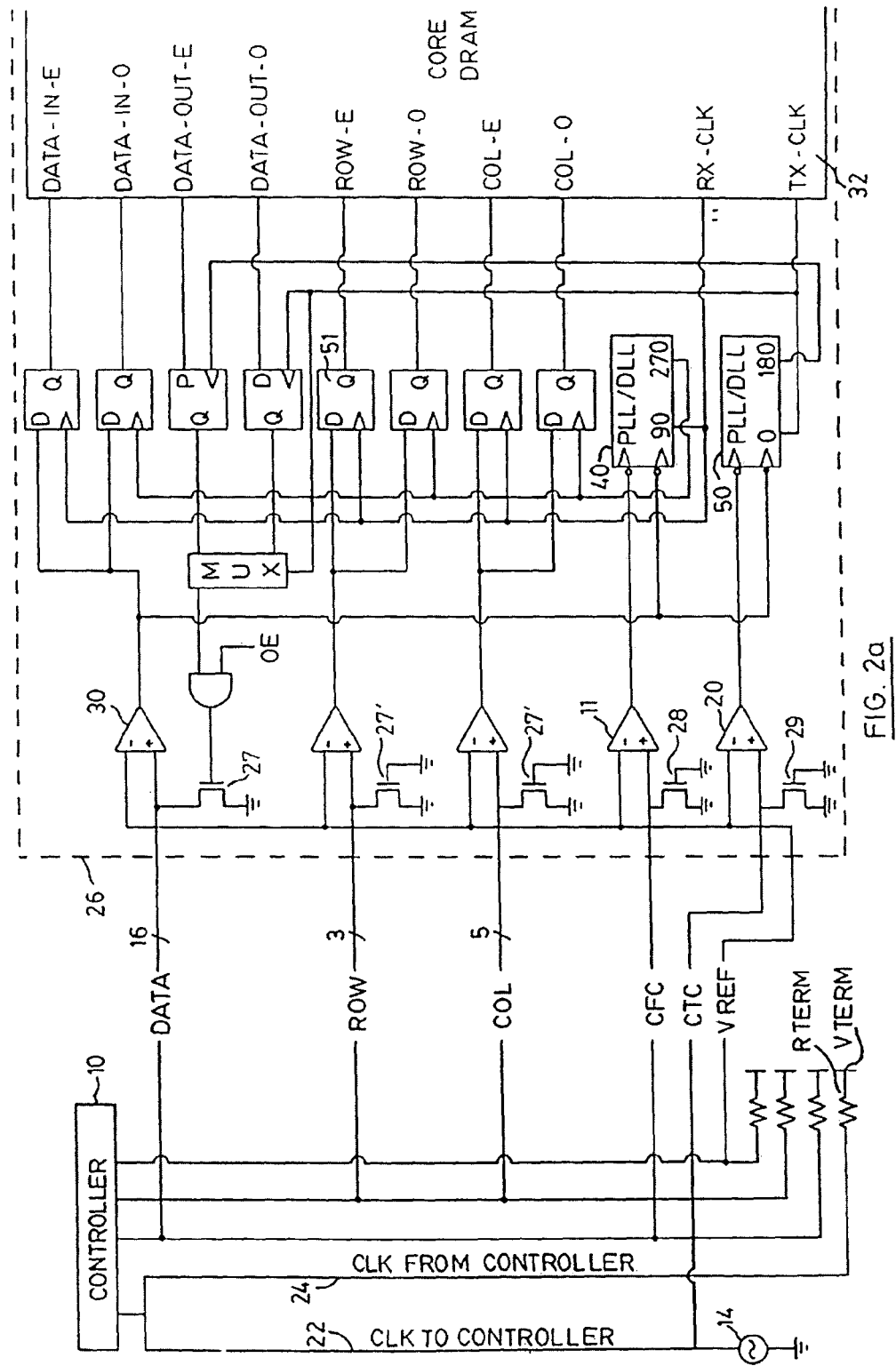
FIG. 2(a) is a schematic diagram of a memory device and its clock synchronization circuitry for the bus topology of FIG. 1(a)
Figure 2B:
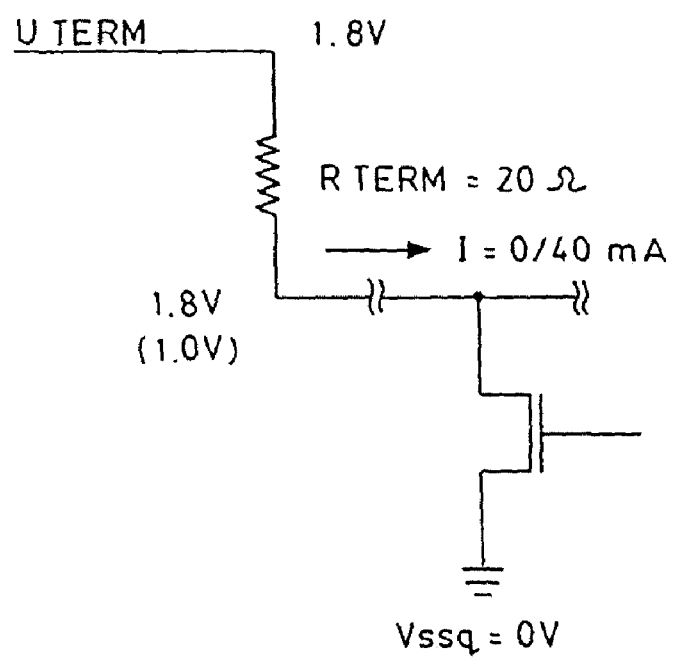
FIG. 2(b) is a schematic diagram of a bus termination circuit.
Figure 3:
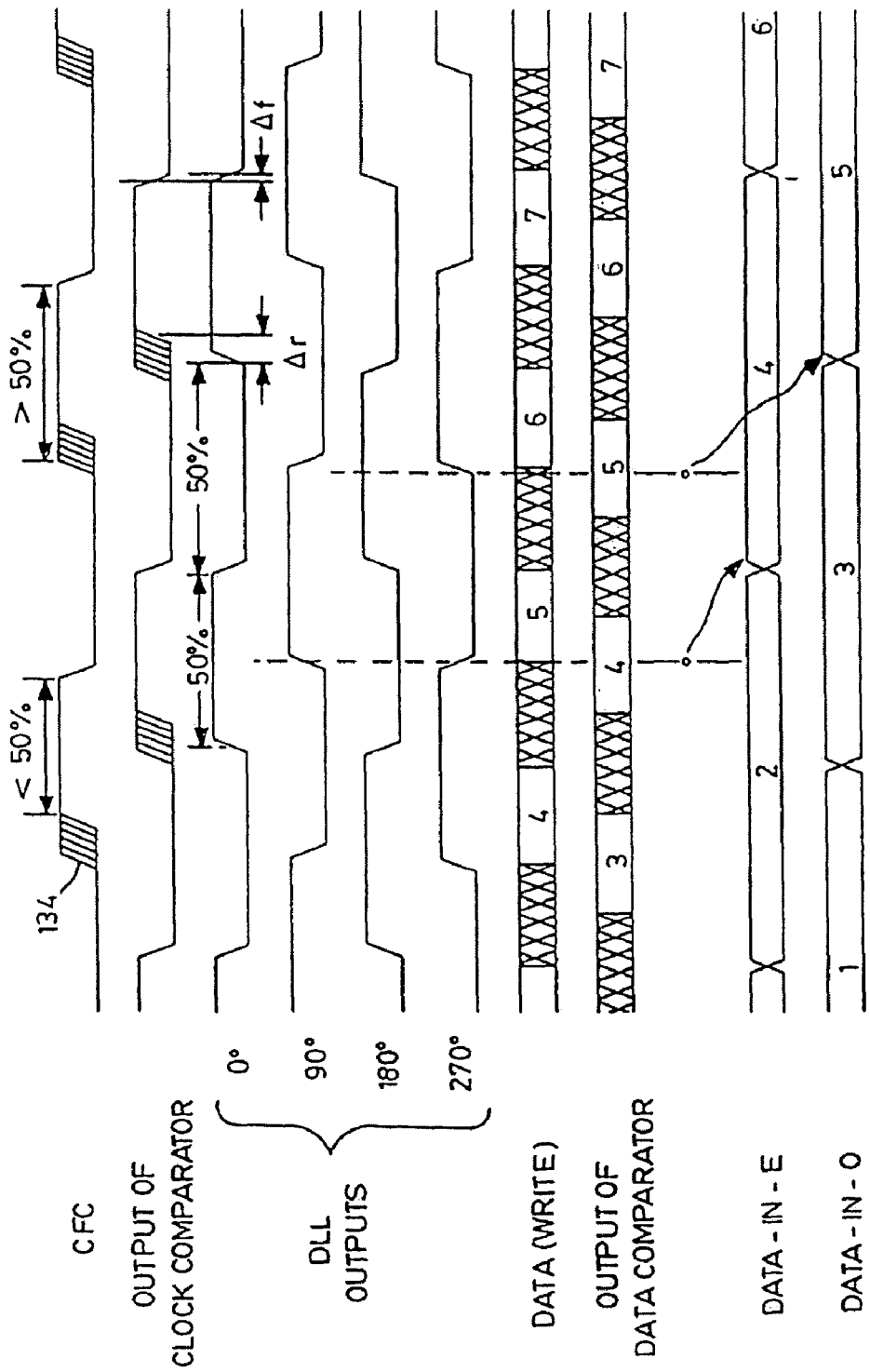
FIG. 3 is a timing diagram showing data input timing for the circuit of FIG. 2(a)
Figure 4:
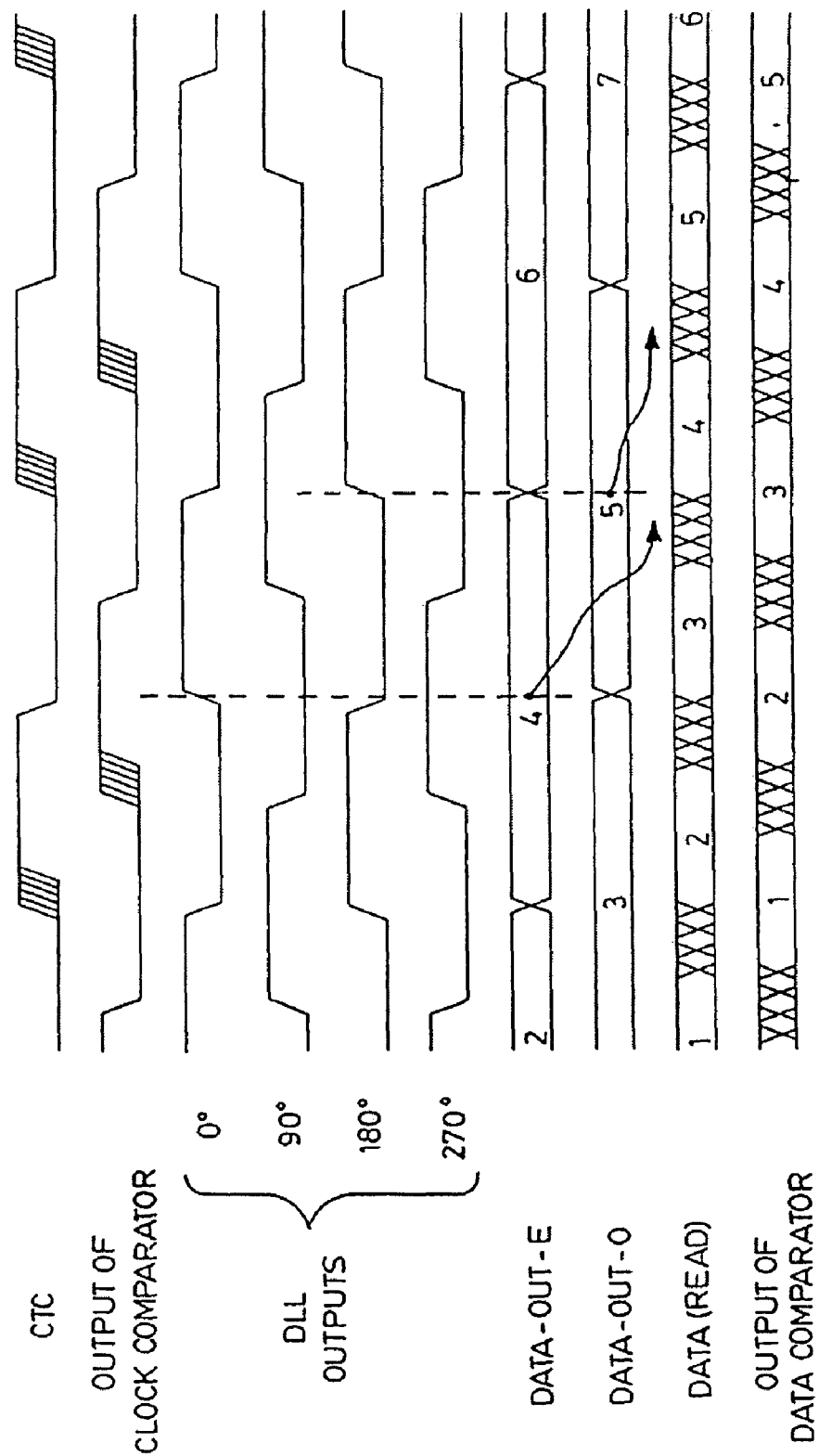
FIG. 4 is a timing diagram showing data output timing for the circuit of FIG. 2(a)
Figure 5:
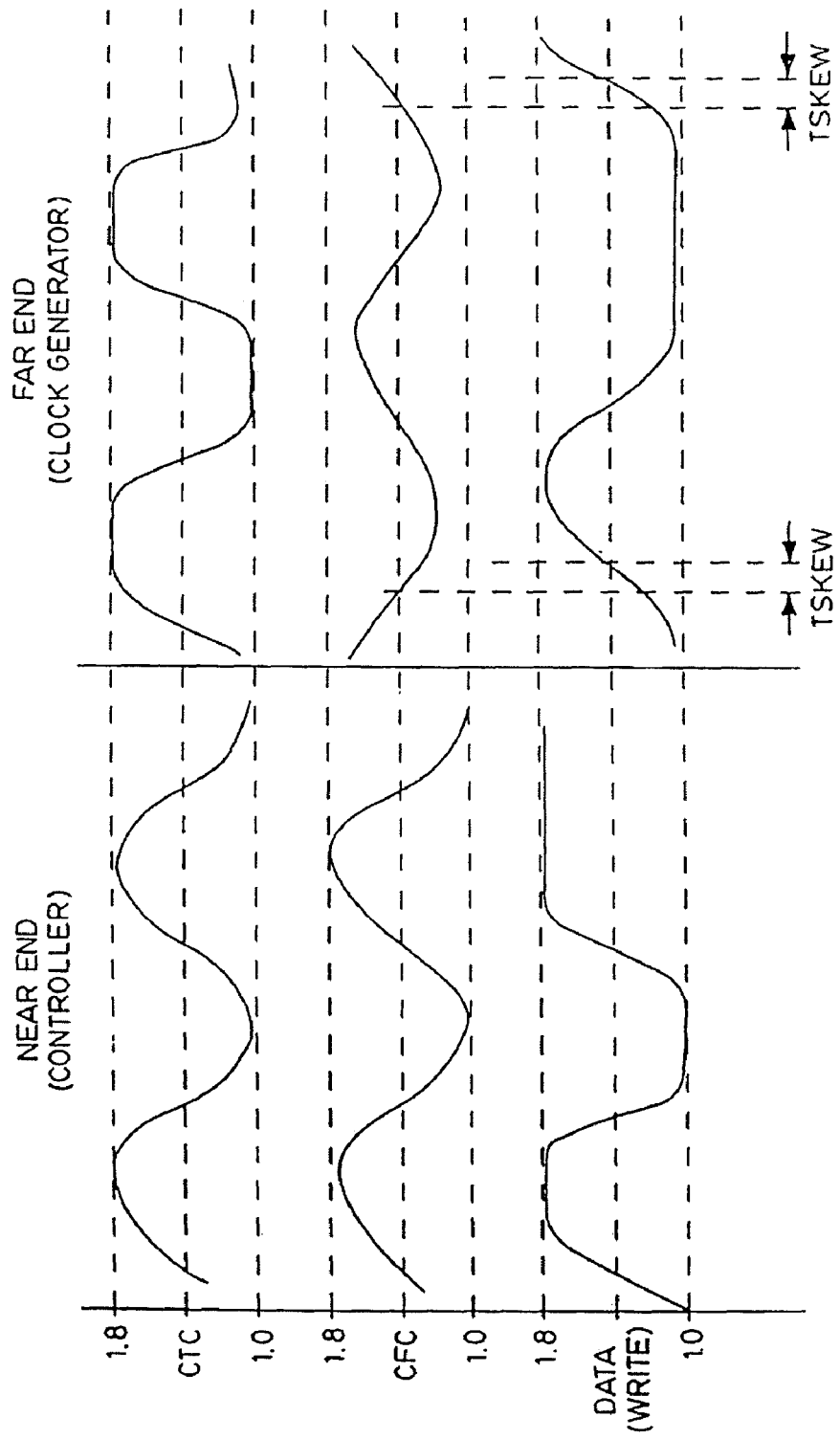
FIG. 5 is a schematic diagram showing a systematic skew between a clock and data signal in the topology of FIG. 1(a)

A further advantage of the present topology is that no changes are necessary in the memory devices 66 from the prior art memory shown in FIG. 2(a) and devices as these will function correctly with the modified source synchronous bus topology. Bus timing will be identical to that shown in FIG. 1(b).

An alternative approach is to change the phase relationship between clock and data to simplify receiving circuitry in both controller an memory devices.

Figure 6B:
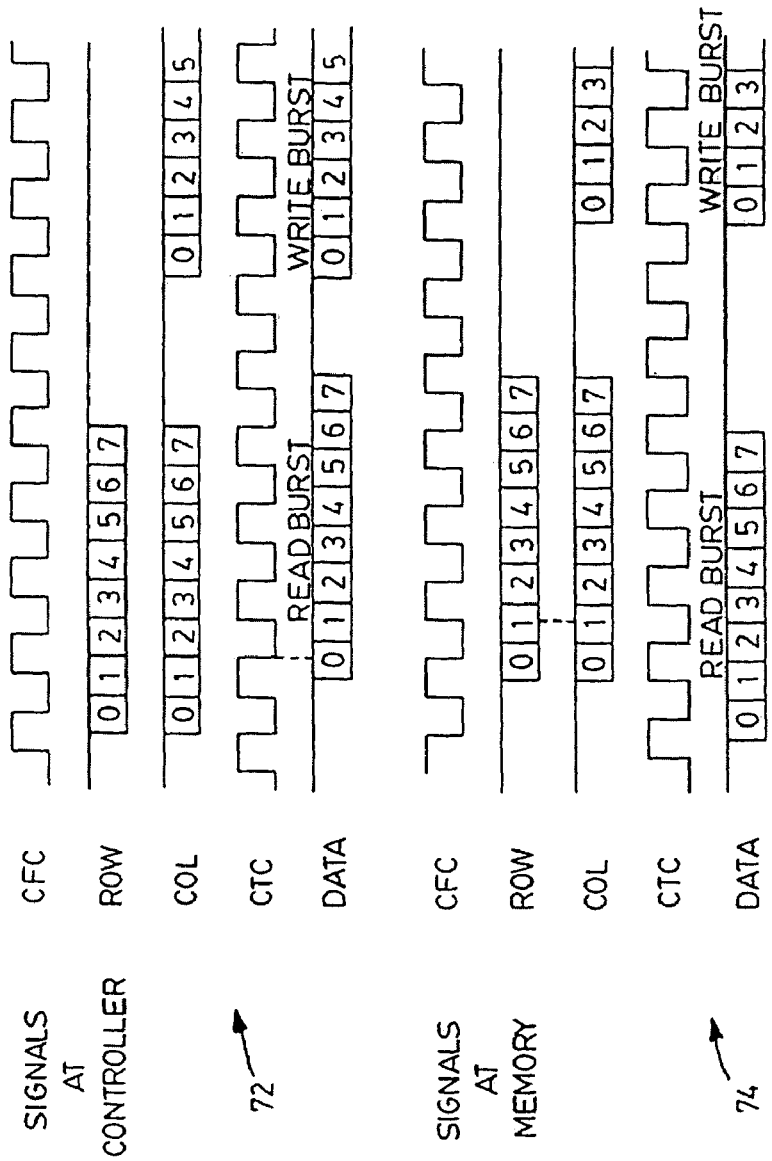
FIG. 6(b) is a diagram showing timing signals of the bus topology shown 6(a)

Referring to FIG. 6(b), the timing waveforms for the bus signal at the controller 64 and the memory device 66 of FIG. 6(a) are shown respectively by numerals 72 and 74. The clock 76 and data 77 waveforms are generated with a 90° relative phase shift, to position clock transitions in the center of the data eye.

Positioning of the clock transitions in the centre of the data eye is accomplished in the controller by selecting appropriate outputs from an on-chip PLL/DLL locked to the free running system clock cFc to separately drive data output and clock output circuits. The approach of the subject invention allows the receiving memory device to use the received clock cFc to latch data directly, without the need for a PLL/DLL, provided clock and data delays to the actual receive data latch are matched. Only one PLL/DLL is required in the memory devices to center read data transitions between edges of the cTc clock, saving both power and die area.

Figure 7:
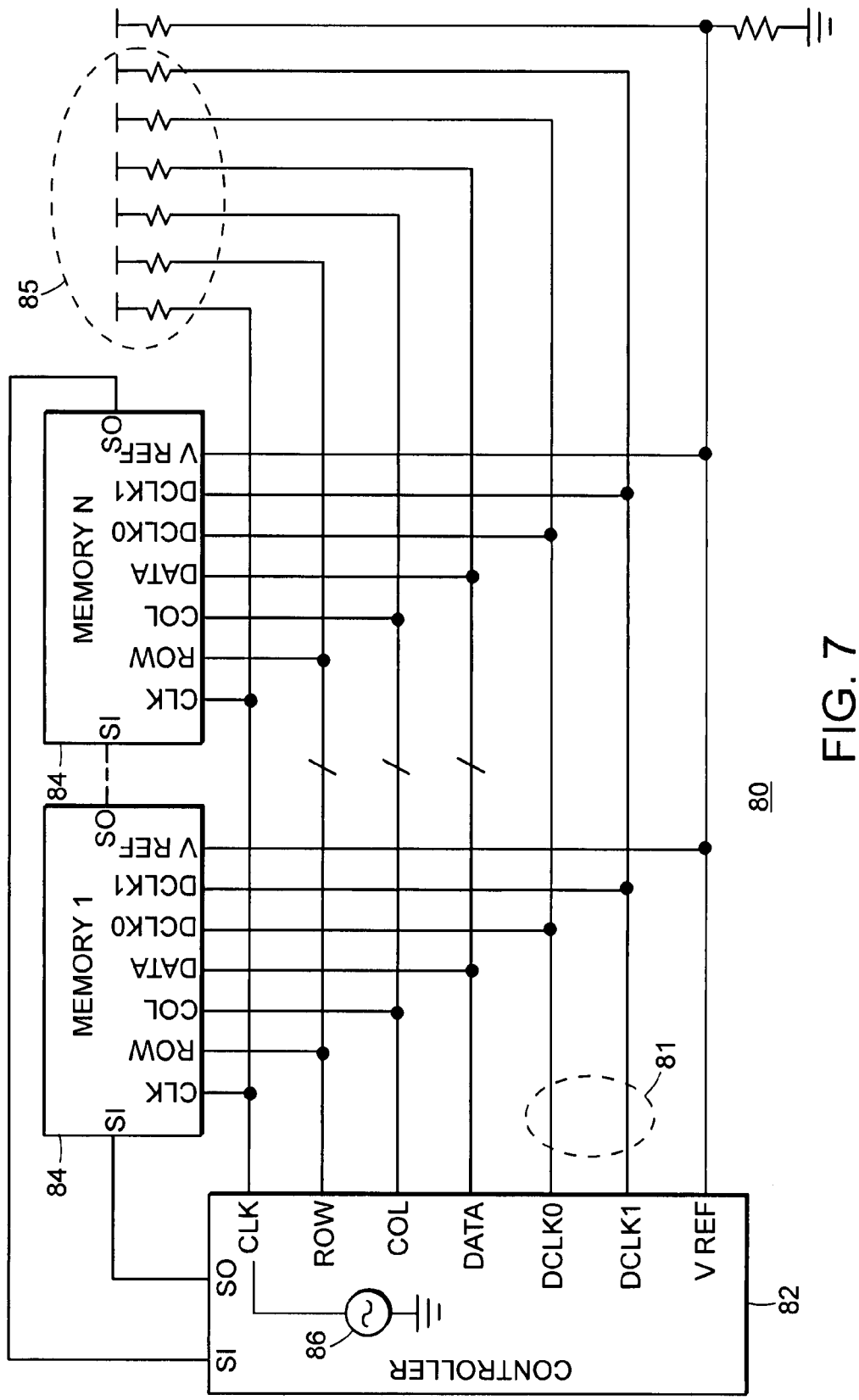
FIG. 7 is a schematic diagram of a bus topology according to a second embodiment of the present invention.

Another embodiment of the present invention, illustrated in FIG. 7, is shown by numeral 80, which shows a bus scheme having fully source synchronous clocking, including data clocks 81, dclk0, dclk1, and a free running reference clock CLK. The memory devices 84 and the controller 82 drive clocks to accompany read data and write data. The controller 82 includes a clock generator 86 for generating the free running reference clock CLK. This single clock CLK is driven from the controller 82 in a source synchronous fashion with row and column command packets on the ROW and COL lines. The clock line ClK is now identical in length and loading to the ROW/COL command and data busses in the system. The clock is terminated at the far end 85.

Clock and data waveforms are matched at all points in the system. The proper positioning of data bursts from different devices is achieved by latency calibration under control of the memory controller. This makes the loop-back clock bus as described in FIG. 6(a) unnecessary. Although the clock is shown as a single ended signal, it may in fact be implemented as a differential signal driving both inputs of an input comparator within each memory device. This eliminates sensitivity of the clock path to Vref threshold variations and common mode noise throughout the system.

The controller 82 and memory devices 84 also include an SO and SI terminal for providing a low speed serial daisy chain from controller through all the memory devices 84 and baclr to the controller 82 to indicate when all memories have synchronized. The operation of this will be described later.

The source synchronous data clocks dclk0 and dclk1 are provided in the controller 82 for timing data in a source synchronous manner. During read operations, the memory devices 84 drive one of the data clocks dclk0 and dclk1 in a source synchronous manner along with read data on the data-bus. The controller 82 schedules which of the data clocks should be used and supplies this information to the memory either in the.column command packet or through another control path. The controller 82 therefore knows which data clock to use to latch in read data. In one embodiment, the memory devices use the free running clock to latch write data in the same way that ROW and COL command packets are latched. However, the preferred embodiment uses data clocks for write data input latching in the 10 memory devices. This allows the data path to be routed or buffered independently of the control path. This has advantages in creating hierarchical memory subsystems as will be described later.

Figure 8A:
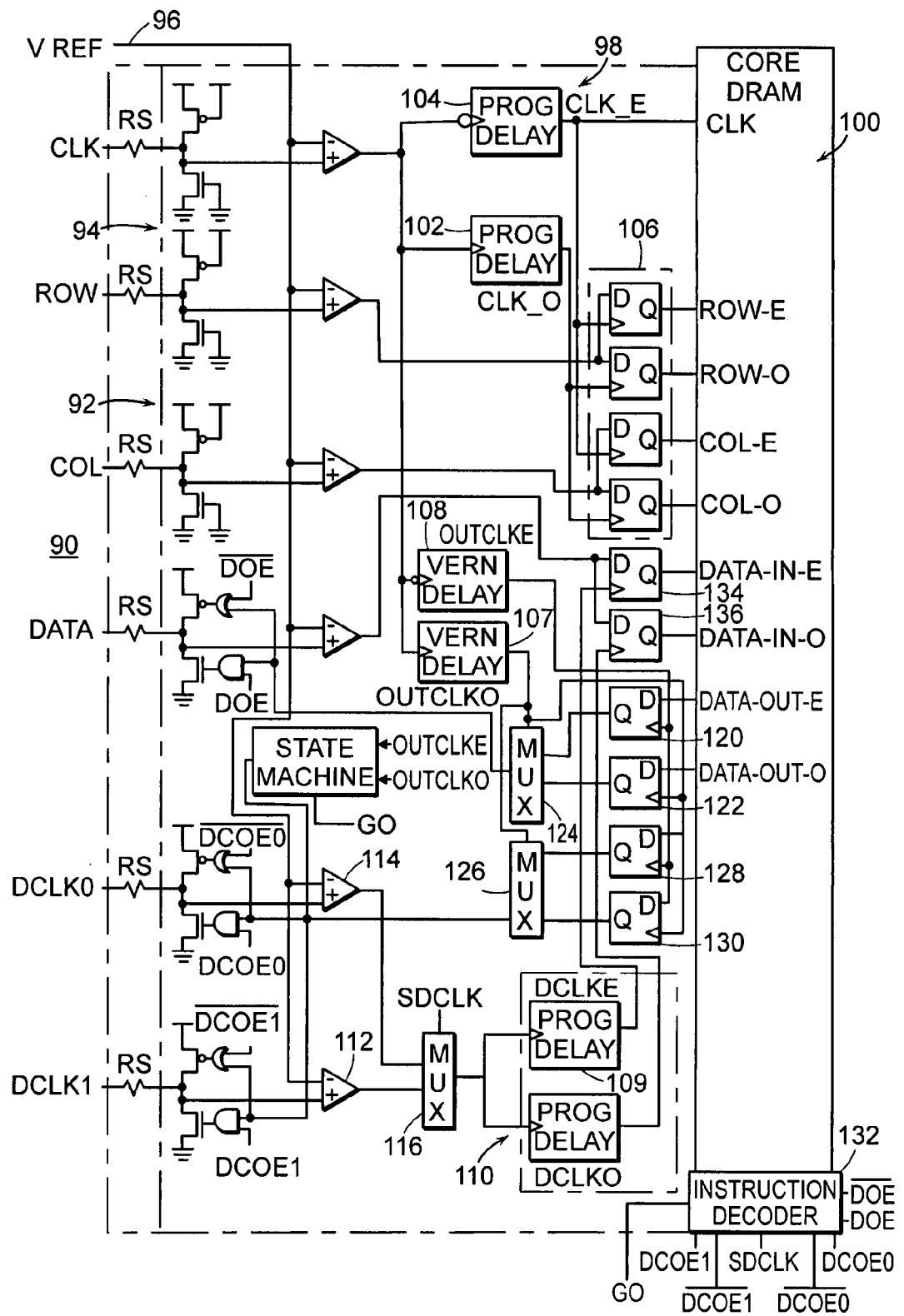
FIG. 8(a) is a schematic diagram of an input interface according to an embodiment of the present invention.

Referring to FIG. 8(a) a memory device interface circuit for use in the source synchronous scheme of FIG. 7 is shown generally by numeral 90. The interface comprises 15 input terminals for connection of the device to appropriate signals on the bus; an I/O driver section 94 employing push-pull configured transistors for driving both '0' and '1' data; an input stub section having series stub resistors $R_S$ interposed between each input terminal and the push-pull drivers; a reference voltage input 96 and a command and data interface section 98 converting the externally received command and data signals as well as clock signals into 20 internal signals.

The command and data interface section 98 includes programmable delay elements for driving the core DRAM with appropriately delayed internal signals (as will be described later). This section also receives signals from the core DRAM for driving onto the bus including generating the dclk0 and dclk1 clocks for source synchronous transmission with the data.

An advantage of the above interface configuration is that signal logic level transitions are better controlled since both 0's and 1's originate from drivers within the transmitting device. This allows both rising and falling edge clocks to be used to latch data compared to the prior art wherein only falling edges were used.

The command and data interface 98 shown in FIG. 8(*a*) includes a first set of 30 programmable delay circuits 102 and 104 for delaying both the rising and falling edges of the received clock CLK, producing the even clock CLK_E and odd clock CLK_O signals, which latch even and odd row commands row_E, row_O as well as even and odd column commands col_E, col_O in the core DRAM via D-type flip-flops 106.

Separate programmable fine vernier delays 107 and 108 receive as inputs the clock signal CLK and delay the rising and falling edges to generate delayed signals OUTCLKE and OUTCLKO. These signals drive the clock input of respective D-type latches 120 and 122 for latching the even Data_Out_E and odd Data_Out_O output data signals from the core DRAM. The latched data output signals are processed one at a time by multiplexer 124, which drives the selected latched data signal onto the data line. The multiplexer 124 is controlled by one of the clock signals, OUTCLKO in this case. The same signal controls a multiplexer 126, which selects one of the signals OUTCLKE and OUTCLKO latched in respective D-type latches 128 and 130, which drive the dclk0 and dclk1 lines to achieve source synchronous clocking. The first multiplexer 124 selects between odd and even data and the second multiplexer selects between odd and even clocks. This allows synchronization of the output data with the output clocks. The input latching circuitry can therefore be optimized to work in the presence of non-symmetrical clock duty cycles, since odd and even data are latched by odd and even edges of the associated source synchronous clock. An instruction decoder 132 provides the relevant signals, such as the data clock output enable signals DCOE1, −DCOE1, DCOEO, −DCOEO; select data clock signal SDCLK; signal for initiating the preamble state machine GO; and data output enable signals DOE and −DOE.

The data input to the memory is also synchronized with the data clocks dclk0 and dclk1. The data clocks dclk0 and dclk1 are received at the inputs of a multiplexer 116, which is controlled by a SDCLK signal generated by the instruction decoder 132. The data clocks are delayed by programmable delays 109 and 110 to produce respective even and odd delayed clocks DCLK_E and DCLK_O. These even and odd clocks are used to clock respective D-type latches 134 and 136, for latching the incoming data as data_in_E and data_in_O.

Figure 9:
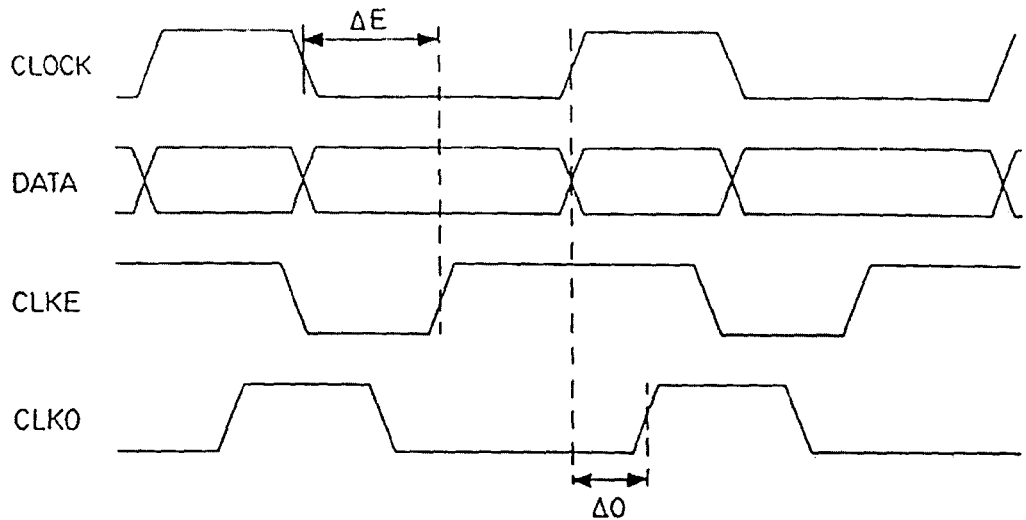
FIG. 9 is a timing diagram showing data recovery with non-symmetrical duty cycle.

The latching of odd and even data is shown in FIG. 9 where a delay $\Delta_E$ between the falling edge of the clock input to the rising edge of clk_E centers the sampling instant in the middle of the data generated with the falling edge of the clock input, and a $\Delta_o$ between the rising edge of the clock input to the rising edge of clk_O centers the sampling instant in the middle of the data generated with the rising edge of the clock input.

With respect to the output buffer structure illustrated in FIG. 8(*a*), the preferred embodiment employs a push-pull output buffer which drives both '0' (Vol=0.9V) and 5 '1' (Voh=1.6V) data. This is based on EIA/JEDEC Standard "Stub Series Terminated Logic for 3.3 Volts (SSTL 3)", EIA/JESD8-8, August 1996, although the levels are scaled down for 2.5 v operation. The series stub resistors Rs isolates the device load from the main transmission line, reducing the bus impedance lowering effect of the device's point capacitive load. Power is lower than the prior art open drain approach because current output levels are +I/2,−I/2 rather than +I,0 for the open drain case.

The reference voltage $V_{ref}$ is equal to the termination voltage of 1.25 V. Assuming for comparison purposes a 20 ohm termination and a 20 ohm series resistor, the current required to create a 0.8 v swing equivalent to the prior art is +/−20 mA. Power consumption is thus data independent at 25 mW per pin, of which only 9 mW is dissipated on chip. Since output current is lower, the output driver transistors can be smaller, further reducing pin capacitance. Most importantly, on-chip I/O power dissipation is much smaller because of the smaller current and the smaller on-chip voltage drop resulting from the series stub resistor. The combined effect of series stub resistor and smaller output driver load capacitance results in higher effective transmission line characteristic impedance, perhaps 30Ω. Consequently, the termination resistor value can be increased which results in further power savings.

As illustrated in FIGS. 8(*a*) and 8(*b*), two data clocks are used to improve bus utilization, dclk0 and dclk1. During the transition between data bursts originating from one device to another, the clock and data lines return to the voltage set by the termination resistor. During this inactive time, the device that is to receive the next data burst must enable its input buffers to start receiving data with the next transition on the clock input. If only a single data clock were employed, the inactive time would have to be extended to allow sufficient safety margin in the receiving device to unambiguously enable its input clock path. Glitches on the data inputs are acceptable since data is sampled, but glitches on the internal clocks can cause a complete breakdown of input data pipelines. The time to merely power up differential input buffers may be longer than a single bit period. Furthermore, there may be different delays in the control path to each device, possibly as a result of address/control buffers that may or may not be present on a module. If a device enables its input path too soon, it may latch the last bit of the preceding burst. If it enables its input path too late, it may miss the first bit of the burst it is intended to receive. The inactive time could be widened to ensure that neither of these errors occur, but this approach would reduce data bus utilization and overall system bandwidth.

A solution, according to an embodiment of the present invention, is to provide the two data clocks dclk0 and dclk1 to allow devices to pass control of the data bus with minimum gap as shown in FIG. 8(*b*). Dual data clocks allow source synchronous clocking to achieve as tight a burst-to-burst timing as in the prior art. The device receiving a burst can enable its input path well in advance of the beginning of the actual data burst during the preamble period when the dclk (dclk1 in this case is used for the right burst) is held at a low level for 3 bit periods. At this time a preceding data burst may actually be present on the data bus with associated activity on the other data clock (in this case a read burst controlled by dclkO is shown). Each successive burst uses the opposite data clock from the previous burst. This can be synchronized on power up by having each device count odd and even bursts, or, by having the controller provide within each read and write command to the memory devices, an indication of which clock to use.

Figure 8B:
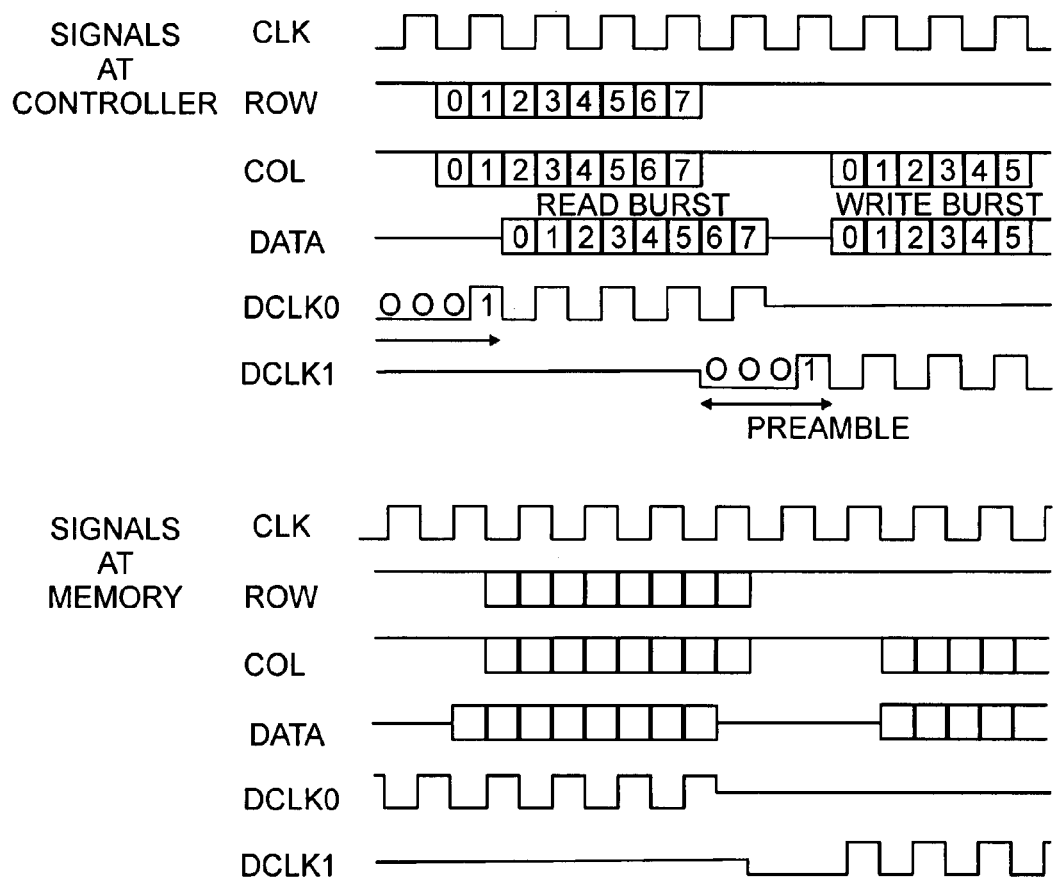
FIG. 8(b) is a timing diagram for the bus topology shown in FIG. 7.

As a further improvement to this scheme, a preamble can be transmitted before the clock transition associated with the first bit of data. Referring back to FIG. 8(a), a state machine 134 is shown for generating the preamble. The state machine receives as inputs the clocks OUTCLKE and OUTCLKO. The preamble is initiated by applying a signal to its GO input. A 1-bit preamble is shown in FIG. 8b. With the 1-bit preamble, the receiving device would ignore the first edge of the clock and begin clocking data on the second edge (with appropriate delay through the vernier). The preamble removes intersymbol interference from the clock pulses. Because the clock starts from a constant low level, the first transitions may be skewed relative to subsequent transitions that occur after the response has reached a steady state. The dual clock approach allows such preambles to be added to the burst without increasing the space between bursts.

Figure 8C:
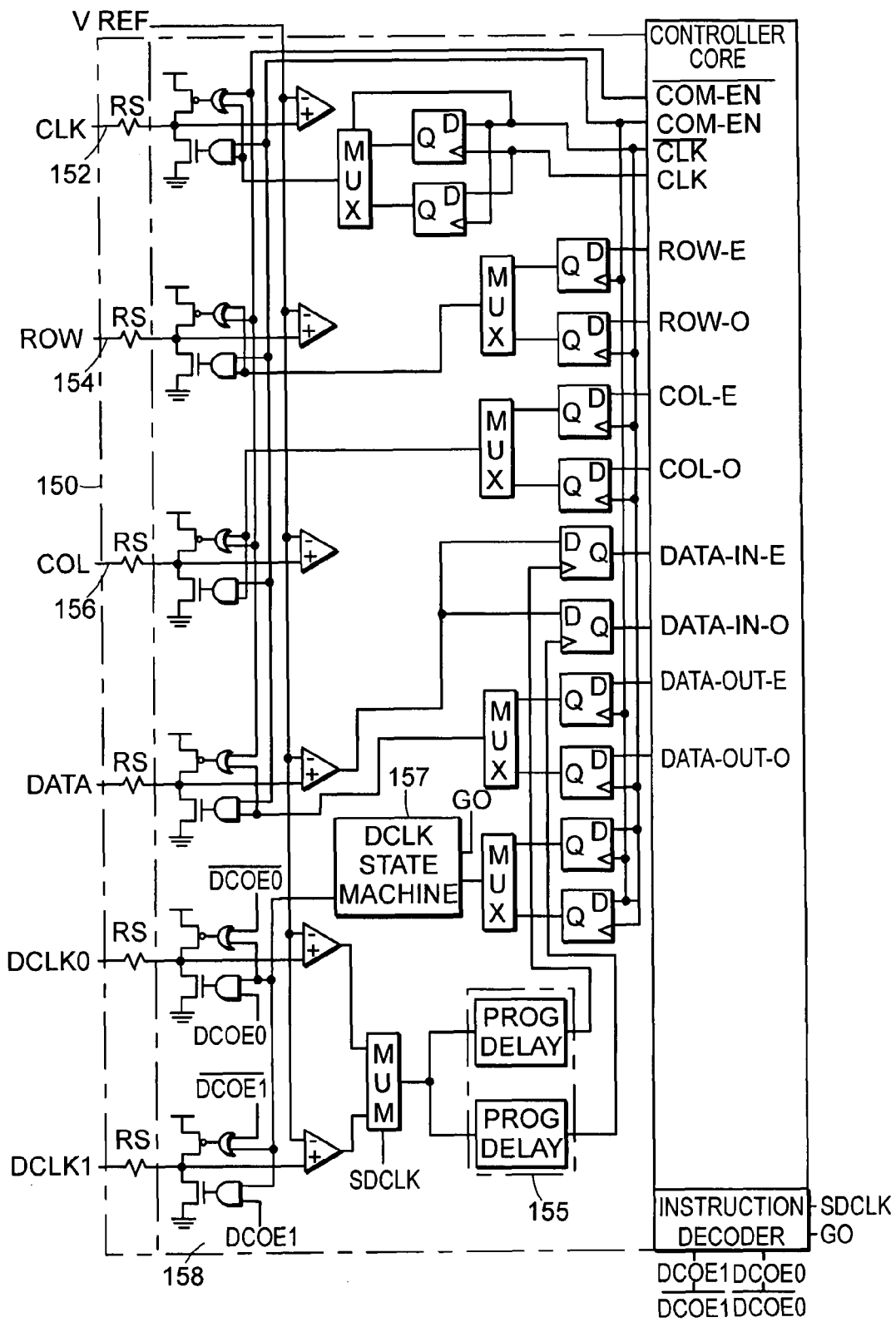
FIG. 8(c) is a schematic diagram of an input interface for a controller according to an 10 embodiment of the present invention.

Referring to FIG. 8(c) a schematic diagram of a controller interface is shown generally by the numeral 150. The interface circuitry 150 in the controller is simpler than that of the memory device shown in FIG. 8(b). Clock CLK 152, ROW 154 and COL 150 command are all outputs driven by identical I/O circuits 158. The outputs are latched on edges of the same internal clock CLK. Dummy input buffers may be included to match input capacitance with the data bus interface circuits. The write data output path is driven by the same clock driving CLK, ROW and COL outputs. Therefore, the write data output fine verniers are not required. The read data input path is the same as the write data input path in the memory. device. Programmable delay elements 155 which are programmed on receipt of the synchronization pattern adjust the received data clock to latch received read data in the controller. As in the memory device interface a state machine 157 is provided for generating the preamble on the dclk's.

Figure 10A:
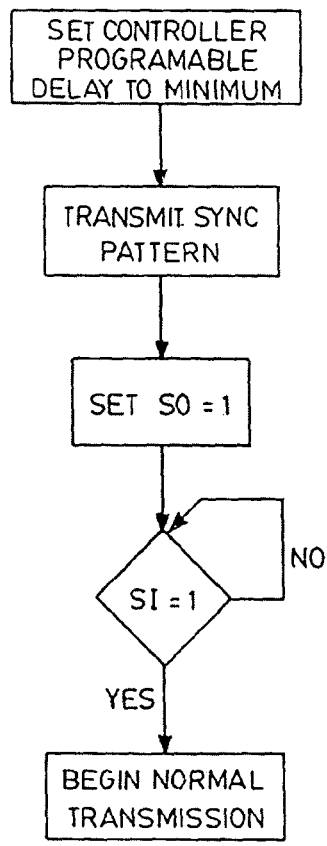
FIGS. 10(a) and (b) are flow charts showing controller and memory synchronization operation.

Referring to FIGS. 10(a) and (b) the sequence of events required on system initialization to synchronize the memory devices to the controller is shown. This relies on the low speed serial daisy chain connection from the controller through all the memory devices and back to the controller to indicate when all memories have synchronized. The controller first sets its programmable delay to minimum and then begins to transmit a synchronization pattern on the outputs accompanied by clock(s). Preferably, the synchronization pattern will be transmitted on all outputs, including row, column, and data busses, although the memories could synchronize based on a single input. The synchronization pattern (hereinafter referred to as the sync pattern) should be a pattern that cannot be confused with a valid command, even when the receiving device is not in sync. The preferred sync pattern will be discussed later in greater depth.

Referring specifically to FIG. 10(a), illustrating the controller synchronization flow, the controller sets its SO output to logic '1' and begins transmitting the sync pattern. When the controller receives a logic '1' at its SI input, indicating that all memory devices in the chain have synchronized, it can begin transmitting normal command packets to the devices.

Figure 10B:
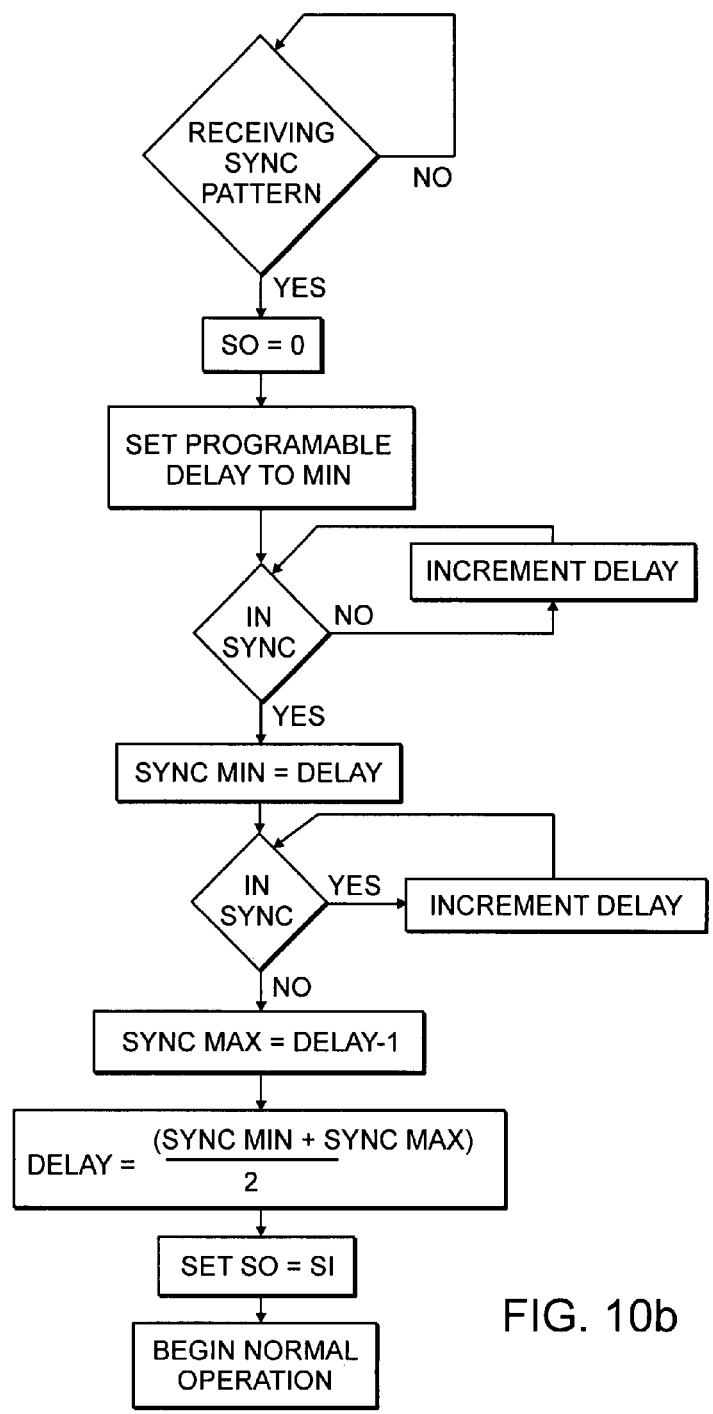

Referring now to FIG. 10(b) the synchronization flow chart for memory devices is shown. When a memory device detects the sync pattern on its input(s), it drives its SO terminal to a logic '0' level and sets the programmable delay blocks 104 and 102 shown in FIG. 8(a) generating CLK_E and CLK_O to the minimum delay settings. The latched received even and odd data from row and column inputs, ROW_E, ROW_O, COL_E, and COL_O is compared to the expected sync pattern. If the received data is identical to the sync pattern on all inputs the device is said to be in sync. The delay settings are incremented to identify a window where the sync pattern is received without error. This represents the composite eye opening for all inputs and the synchronization sequence essentially amounts to stepping through the composite data eye to define its boundaries sync min and sync max. The final delay values written into the programmable delay circuits are set to the center of the window for maximum timing margin.

An identical process occurs for write data inputs to determine the proper settings for DCLK_E and DCLK_O delay circuits 109 and 110. Once all 4 delay values have been determined, the memory device sets SO=SI. A logic '1' will ripple through the serial daisy chain bus as each device completes its synchronization sequence, producing finally, a logic '1' level at the SI input of the controller.

The I/O levels and duty cycle are calibrated and matched in a similar fashion. After synchronization, the controller sends commands to each memory device in turn to drive the data bus with high and low logic levels. The controller then measures the Voh and Vol levels of individual memory devices and sends commands to registers within each device to increase or decrease the levels appropriately. The output drivers are composed of binary weighted segments that can be enabled or disabled depending on the programmed Voh or Vol levels. Because all I/O's are calibrated to a single reference level in the controller, there is less variation between devices and the data eye opening will be improved. In contrast, in the prior art each device calibrates its own output level resulting in variation due to differences in the local reference and termination resistor.

Following the synchronization sequence and I/O level calibration, the controller can then adjust the timing of read data bursts by requesting a read data burst from each memory device in sequence, observing the phase of the received data burst, and then making appropriate adjustments to the output clock delay registers in the memory devices.

The controller may also perform input sampling clock calibration by instructing a memory device to transmit a synchronization pattern on the data bus, and then following the procedure outlined in FIG. 10(b) to adjust its own input sampling clock delay circuits. By performing input sample clock timing adjustment in this manner rather than generating a fixed phase based on the input clock as in the prior art, the preferred embodiment can compensate for skews and mismatches in the wiring, crosstalk between different signals, ground bounce and ISI. Likewise, the read data burst timing adjustment also compensates for system-wide skew, rather than just on-chip skew.

Figure 11A:
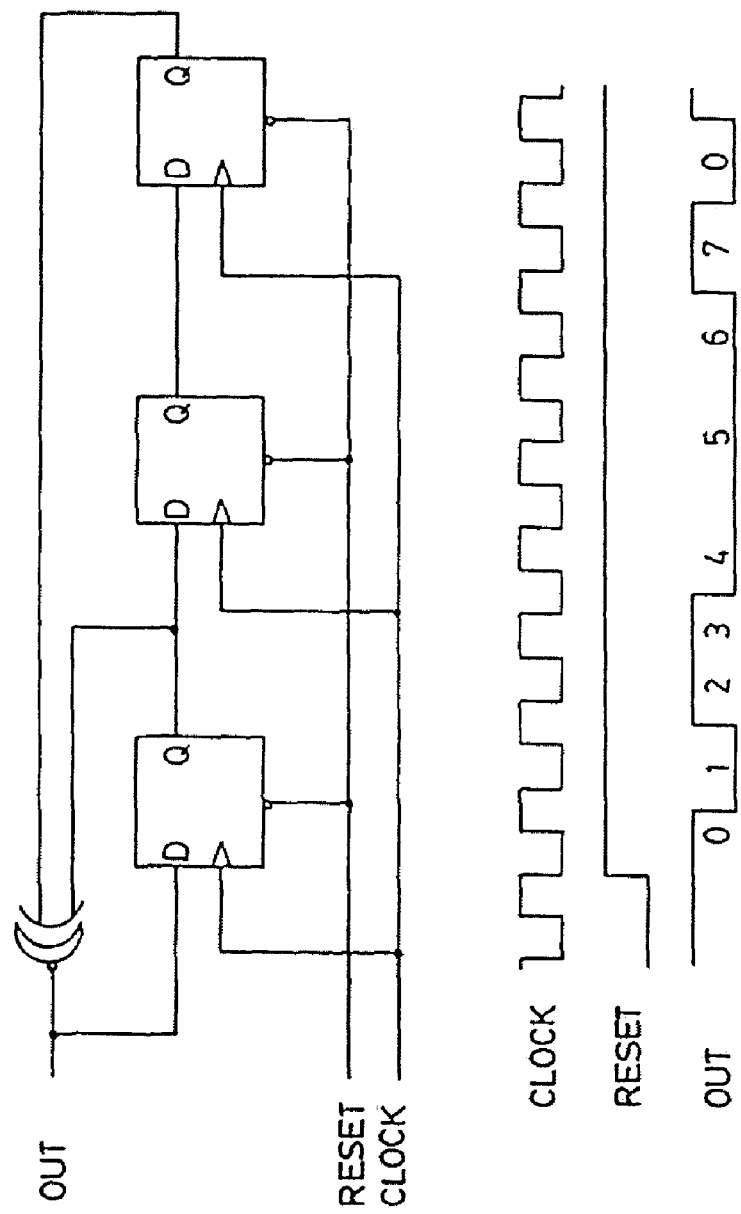
FIG. 11 (a) is a circuit diagram and timing diagram illustrating a psuedorandom sequence generator according to an embodiment of the present invention.
FIG. 11(b) is a circuit diagram of a synchronization pattern detector circuit.

The synchronization pattern must be selected to create a worst case ISI scenario. The sync pattern generator according to an embodiment of the present invention, as shown in FIG. 11(a), creates all possible 3 bit sequences with the exception of '111'. The circuit generates a 7-bit repeating psuedorandom pattern. A useful property of the pattern is that if every $2^{nd}$ bit is sampled, the same 7-bit repeating pseudorandom pattern will result. Therefore, the adjustment of odd and even clock delays in the receiving device can be done independently. The sync pattern can be most easily detected by a sequence of 3 successive '0's. Even if the input clock delays are not properly adjusted it is guaranteed that at least 2 successive '0's would be latched. As long as one bit of a valid instruction stream can never have 2 successive '0's, there will be no ambiguity in identifying when a sync pattern is received. For example, each of the ROW and COL busses should include flaming bits that have this property. Psuedorandom sequences of any desired length $2^N-1$ can be generated in this manner with the appropriate feedback polynomial. Generally, the length of the polynomial should span the settling time of the bus.

Figure 11B:
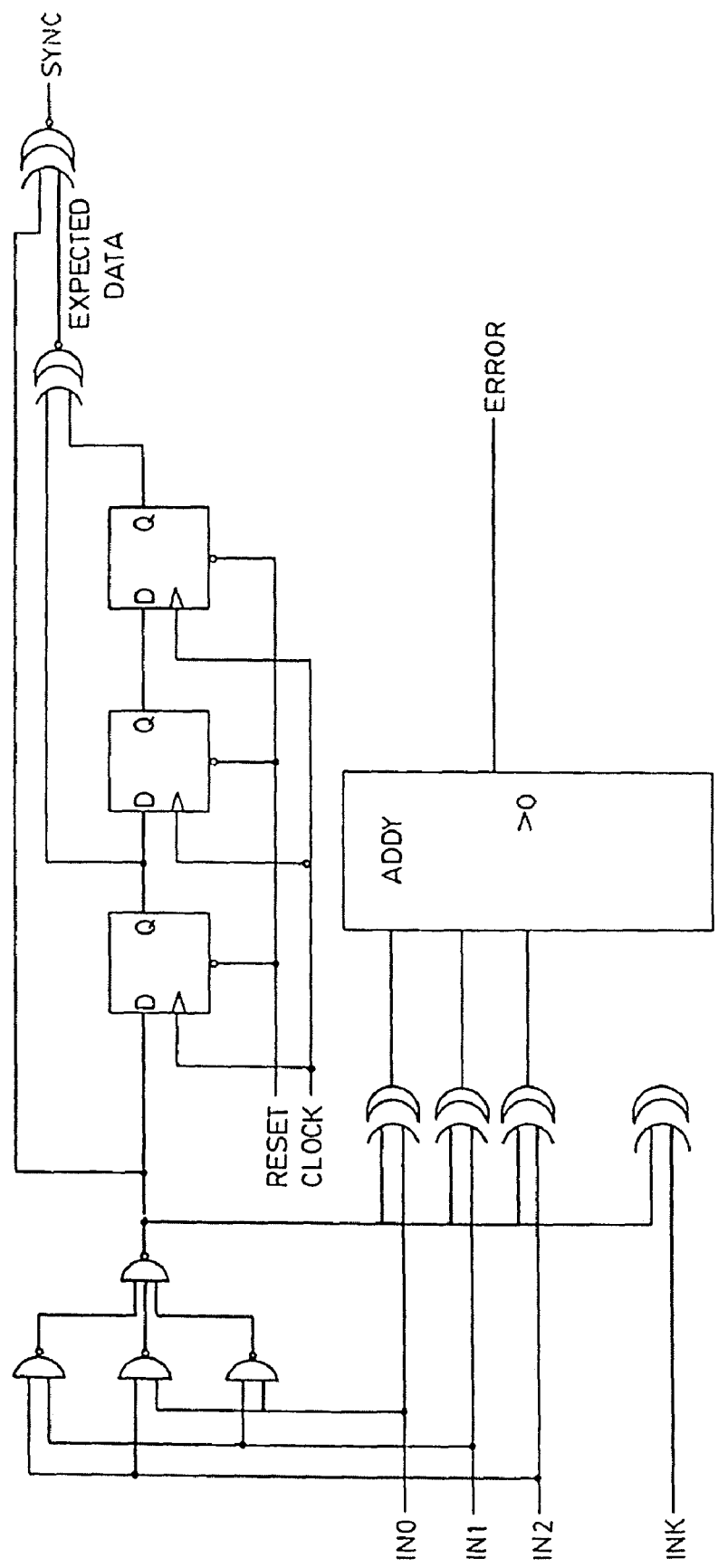

FIG. 11(b) shows the sync detector. In the preferred embodiment, all lines in the bus will be driven with the sync pattern. A best 2 of 3 vote is taken on 3 of the inputs, and the result is compared to each individual input. If any input is different from the best 2 of 3 vote result, then there is an error and the device cannot be considered "in-sync," for that particular input clock delay setting. The best 2 of 3 vote is provided as input to a feed forward version of the psuedorandom generator, which is used to predict the next bit of the sequence. This is compared to the actual received bit to determine whether the device is "in-sync". If the error flag remains inactive and the sync flag remains active for the duration of one full cycle of the 7-bit psuedorandom sequence, then the programmable clock delay setting: represents a valid sampling point within the composite eye.

Another advantage of the present invention is that the number of memory devices connected to a source synchronous bus can be increased through the use of simple bus repeaters, while keeping the loads on a single set of lines to a minimum.

Figure 12:
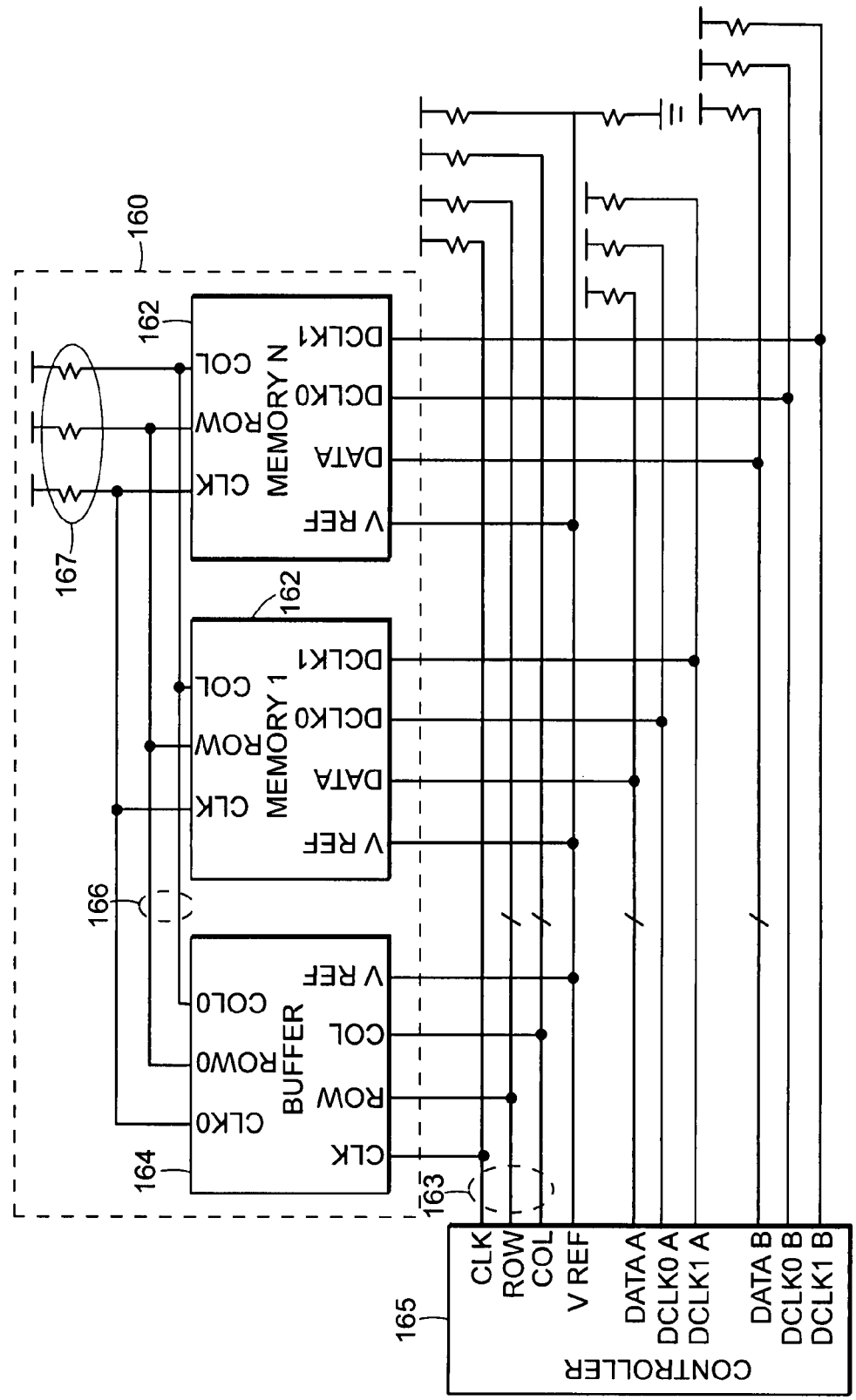
FIG. 12 is a schematic diagram of a bus topology according to a third embodiment of the present invention.

FIG. 12 shows a buffered module 160 that contains two memory devices 162, each driving its respective separate data bus data A and data B back to the controller and having a bus topology similar to that of FIG. 7. This configuration is useful when the application requires more bandwidth than a single memory device could provide. A single row and column command stream 163 is received by a buffer 164 and is directed to more than one memory device 162 on the module along a local row and column command buss 166. The module therefore presents only one load to the bus. Each memory device can operate in parallel to deliver a higher data bandwidth back to the controller 165. The local row and column command bus 166 may be terminated 167. Although the buffer 164 introduces delay into the command path, the relationship between clocks and the associated data remains unchanged. In the buffer, the row and column command busses 163 are latched exactly as they are within the memory devices 162, and then they are regenerated along with the clock clkO to drive the internal bus 166. Read data and write data on busses dataA and dataB are clocked by their respective data clocks dclkA and dclkB in both directions. The additional delay within the buffer 164 can be compensated through timing adjustments made by the controller 165 through writing appropriate delay registers in the memory devices. Because all timing adjustments are made by the controller, it is possible to mix buffered and unbuffered modules in the same system and achieve consistent timing between all memories. This increased bandwidth with no additional drawbacks to the system contrasts the prior art approach which was limited to 32 devices.

For memory systems requiring deeper address space it is also possible to buffer the data busses and connect more than one memory device on each module to the main databus. The databus buffers must capture and regenerate signals bidirectionally.

Referring to FIGS. 13(a) and 13(b), a prior art memory module in which the main busses are run through the module itself to minimize stub lengths, is indicated generally by numeral 170. The modules include a circuit board 172, having a plurality of memory devices 174 and a pair of connectors 175 arranged along one edge of the board 172 and spaced at opposite ends thereof. A clock generator 176 and termination resistors 178 are positioned on the main motherboard 180 at the far end of the bus. The bus enters the module at one end 182, travels through the module making connection to each memory device, and then exists the module at the opposite end 184. To maintain bus connectivity in systems that are not fully populated with memory, it is necessary to insert dummy modules.

Referring to FIG. 14(a), a schematic termination diagram of a module with memory 190 according to an embodiment of the present invention is shown. The module 190 includes a clock generator 192 and the termination resistor 194 with a plurality of memory devices 196. Computing of signals to the module from the bus is made via a set of contacts 198 at one edge of the module. Only one such termination module would be required in a system, rather than many dummy modules in a highly expandable but sparsely populated memory system. The termination module can be made reversible so that it can plug into even or odd module sockets. When the memory system is to be upgraded with an additional module, the termination module may be shifted one slot further out to create a space for the additional memory. The termination module includes memory devices, so that motherboard sockets can be maximally utilized. A system that is not fully populated may operate at a higher frequency because the bus is shorter and attenuation and timing skew at a given frequency will be lower. In FIG. 14(b), a schematic diagram of a termination module without memory is shown generally by numeral 200. This module differs from that of FIG. 14(a) only in that it does not include memory devices. It may be seen that in the modules 190 and 200, the bus does not travel through the module.

The chip packaging employed in the prior art devices is a uBGA (micro Ball Grid Array) chip scale package which is roughly the same size as the die. These packages have shorter stub lengths than conventional packaging. The stub includes the length of the bond wire, the lead frame, and the via to the main bus. This length may be approximately 5 mm. At lower frequencies, a stub of this length will not degrade the transmission line properties of the main bus significantly, although the point capacitive load of the chip I/O structure is of concern. At operating speeds greater than 1 Gb/s, even a 5 mm stub can degrade performance.

Figure 15A:
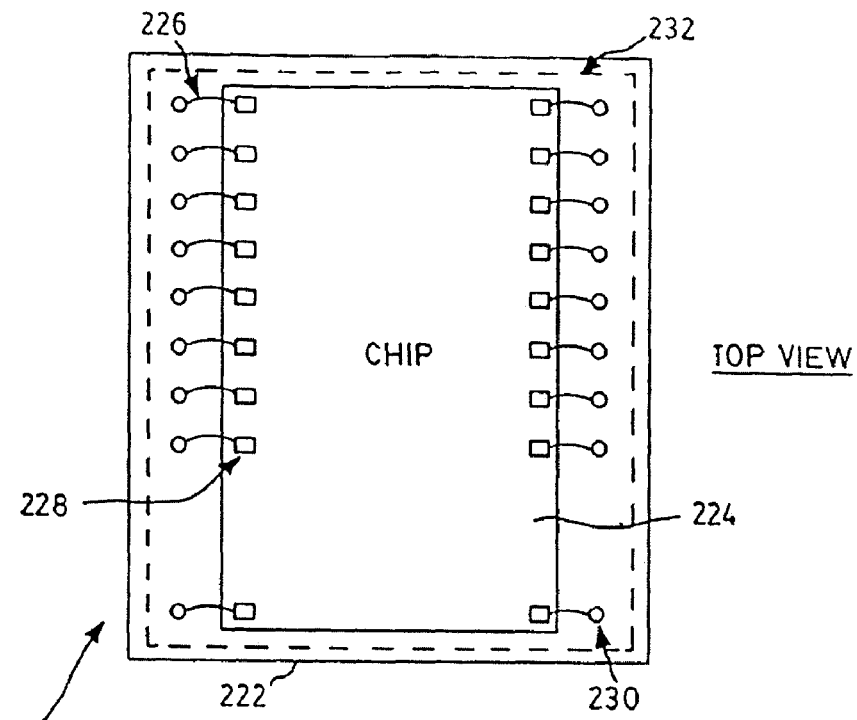
FIGS. 15(a) and 15(b) are respective top and bottom plan views of a semiconductor packaging according to one embodiment of the invention.
Figure 15B:
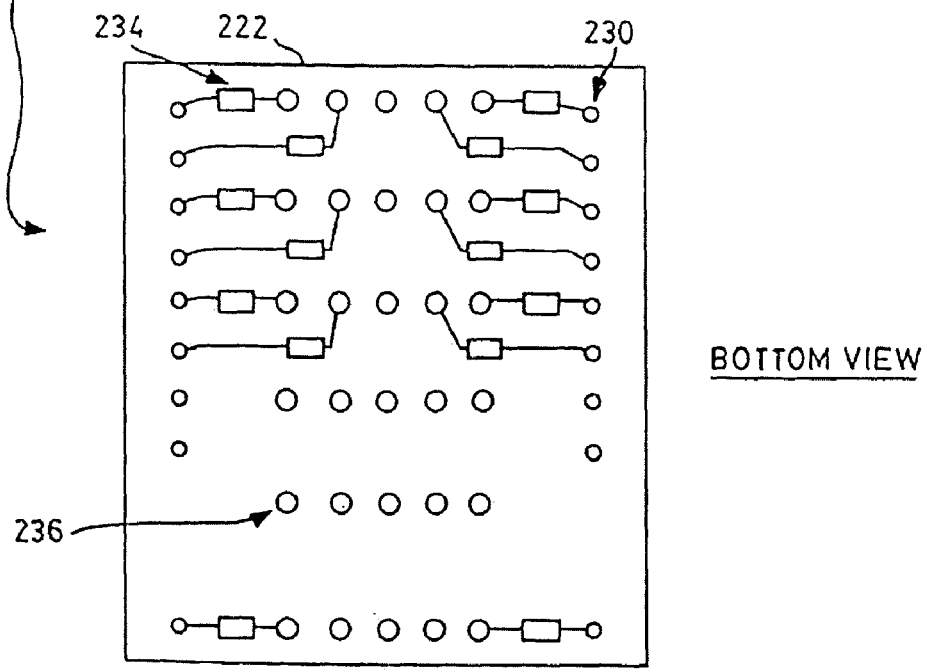

Referring to FIGS. 15(a) and 15(b), a respective top and bottom views of a uBGA package according to an embodiment of the present invention, is shown by numeral 220. The packaging consists of a BGA substrate 222, to which is mounted on a top surface thereof chip 224. Bonding wires 236 are connected from the bonding pads 228 via through-holes 230 to a bottom surface of the substrate 222. The top side is encased in a plastic encapsulation 232.

Referring to FIG. 15(b), the bonding wires are connected to deposited resistors 234 to 5 BGA balls 236 on the bottom of the substrate.

The series resistor film 234 near the BGA solder ball 236 acts to minimize the effect of the stub and point load of the chip I/O. The resistor, typically 20 ohms, is located as close to the ball as possible to isolate as much of the stub as possible from the main bus so that reflections are quickly damped. The resistor is created by depositing a resistive material on selected areas of one layer of the uBGA substrate, or by depositing resistive material over the entire layer and then etching the unwanted material away, using pholithographic processes. With this approach, the series resistor is located very close to the main transmission line, and no additional board area is required for discrete resistors.

While the invention has been described concerning a specific embodiment thereof and in a specific use, various modifications thereof will occur to those skilled in the art without departing from the spirit of the invention.

The terms and expressions which have been employed in the specification are used as terms of description and not of limitations, there is no intention in the use of such terms and expressions to exclude any equivalents of the features shown and described or portions thereof, but it is recognized that various modifications are possible within the scope of the invention.

What is claimed is:

1. A Dynamic Random Access Memory (DRAM) controller configured for communication with at least one semiconductor device over an interface, the DRAM controller comprising:
   a) data terminals for coupling to the interface and for providing data signals for transmission to the semiconductor device;
   b) at least one data clock terminal for coupling to the interface and for providing at least one aperiodic data clock signal for transmission to the semiconductor device;
   c) data output drivers for driving said data signals on said data terminals;
   d) at least one clock driver for driving said at least one aperiodic data clock signal on said at least one data clock terminal; and
   e) resistive termination devices within said DRAM controller and coupled to each of said data and data clock terminals, and said resistive termination devices being integrated with said DRAM controller on a semiconductor chip.

2. The DRAM controller as claimed in claim 1 wherein said resistive termination devices are termination resistors.

3. The DRAM controller as claimed in claim 2 wherein said termination resistors are series stub termination resistors.

4. The DRAM controller as claimed in claim 1 wherein said at least one data clock terminal is a pair of terminals.

5. The DRAM controller as claimed in claim 4 wherein said at least one aperiodic data clock signal is two clock signals.

6. The DRAM controller as claimed in claim 5 wherein a selected one of said data clock terminals is driven during a particular write operation.

7. The DRAM controller as claimed in claim 1 wherein said at least one aperiodic data clock signal is preceded by a preamble.

8. The DRAM controller as claimed in claim 7 wherein said preamble begins with an interval held to a low logic level for more than a one bit interval.

9. The DRAM controller as claimed in claim 8 wherein said preamble consists of the bit pattern '0001'.

10. The DRAM controller as claimed in claim 1 wherein said data terminals and said at least one data clock terminal are bidirectional terminals.

11. The DRAM controller as claimed in claim 1 wherein a data rate of said data signals is double data rate.

12. A Dynamic Random Access Memory (DRAM) system comprising:
   a) at least one DRAM including resistive termination devices within said at least one DRAM and integrated with said at least one DRAM on a semiconductor chip;
   b) a DRAM controller; and
   c) a data bus having said resistive termination devices coupled to it, said data bus for providing write data from said DRAM controller to said DRAM, and for providing read data from said DRAM to said DRAM controller, the data bus including at least one data clock line that is driven with an aperiodic data clock signal.

13. The DRAM system as claimed in claim 12 wherein said resistive termination devices are termination resistors.

14. The DRAM system as claimed in claim 13 wherein said DRAM further includes push-pull output drivers enabling device application of said read data to said data bus.

15. The DRAM system as claimed in claim 13 wherein said termination resistors are series stub termination resistors.

16. The DRAM system as claimed in claim 13 wherein said data bus is configured to carry Double Data Rate (DDR) data signals.

17. The DRAM system as claimed in claim 14 further comprising at least two power supplies electrically connected to said push-pull output drivers.

18. The DRAM system as claimed in claim 17 wherein said push-pull output drivers include p-channel pull-up transistors and n-channel pull-down transistors, and said two power supplies are a $V_{ss}$ power supply electrically connected to the sources of said n-channel pull-down transistors, and a $V_{dd}$ power supply electrically connected to the sources of said p-channel pull-up transistors.

19. The DRAM system as claimed in claim 12 wherein said at least one data clock line is a source synchronous data clock line.

20. The DRAM system as claimed in claim 12 wherein said at least one data clock line is a pair of data clock lines.

21. The DRAM system as claimed in claim 20 wherein a selected one of said pair of data clock lines is driven during a particular data transfer operation.

22. The DRAM system as claimed in claim 12 wherein the aperiodic data clock signal on said at least one data clock line is preceded by a preamble.

23. The DRAM system as claimed in claim 22 wherein said preamble begins with an interval held to a low logic level for more than a one bit interval.

24. The DRAM system as claimed in claim 22 wherein said preamble consists of the bit pattern '0001'.

25. A Dynamic Random Access Memory (DRAM) comprising:
   a) a first terminal for coupling to a clock line;
   b) a plurality of second terminals for coupling to a command bus providing address and control information to the DRAM, said clock line and said command bus comprising a source synchronous bus;
   c) resistive termination devices within the DRAM and coupled to said plurality of second terminals, and said resistive termination devices being integrated with the DRAM on a single chip; and
   d) at least one third terminal for coupling to at least one data clock line that is driven with an aperiodic data clock signal.

26. The DRAM as claimed in claim 25 wherein said resistive termination devices are termination resistors.

27. The DRAM as claimed in claim 26 wherein said termination resistors are series stub termination resistors.

28. The DRAM as claimed in claim 25 wherein said resistive termination devices are termination resistors.

29. A Dynamic Random Access Memory (DRAM) system comprising:
   a) at least one DRAM including output drivers;
   b) a DRAM controller including output drivers;
   c) a bidirectional data bus for providing write data from said at least one DRAM controller to said at least one DRAM, and for providing read data from said at least one DRAM to said DRAM controller, said drivers of said DRAM controller and said at least one DRAM for driving write and read data, respectively, onto said data bus, and said data bus including at least one data clock line that is driven with an aperiodic data clock signal; and d) resistive termination devices located within said at least one DRAM and coupled to said data bus, and said resistive termination devices being integrated with said at least one DRAM on a single chip.

30. The DRAM system as claimed in claim 29 wherein said resistive termination devices are termination resistors.

31. The DRAM system as claimed in claim 29 further comprising a command bus for carrying, from said DRAM controller to said at least one DRAM, address and control signals for providing address and control information.

32. In a Dynamic Random Access Memory (DRAM) controller, a method for synchronization comprising:
   a) resistively terminating data bus terminals and data clock terminals of the DRAM controller with termination resistors integrated with said DRAM controller on a semiconductor chip;
   b) receiving aperiodic data clock signals on said data clock terminals;
   c) generating a data sampling clock with said aperiodic data clock signals;
   d) receiving read data signals on said data bus terminals; and
   e) sampling the received read data signals with said data sampling clock so that the data input to the device is synchronized with the aperiodic data clock signals.

33. The method as claimed in claim 32 wherein said resistively terminating said data bus terminals and said data clock terminals is accomplished with a series stub termination resistor.

34. The method as claimed in claim 32 wherein said aperiodic data clock signals is two aperiodic data clock signals.

35. The method as claimed in claim 34 wherein a selected one of said two aperiodic data clock signals generates said data sampling clock for a particular read operation.

36. The method as claimed in claim 32 wherein said data clock terminals is a pair of terminals.

37. The method as claimed in claim 36 wherein said aperiodic of data clock signals are delayed through programmable delay circuits to generate said data sampling clock.

38. The method as claimed in claim 32 wherein said aperiodic data clock signals are preceded by a preamble.

39. The method as claimed in claim 38 wherein said preamble begins with an interval held to a low logic level for more than a one bit interval.

40. The method as claimed in claim 39 wherein said preamble consists of the bit pattern '0001'.

41. The method as claimed in claim 32 wherein said write data signals are Double Data Rate (DDR) signals.

42. The method as claimed in claim 32 wherein said intermittent data clock signals are source synchronous data clock signals.

43. The method as claimed in claim 32 wherein said data bus terminals and said data clock terminals are bidirectional terminals.

* * * * *

UNITED STATES PATENT AND TRADEMARK OFFICE
CERTIFICATE OF CORRECTION

| | | |
|---|---|---|
| PATENT NO. | : 8,266,372 B2 | Page 1 of 1 |
| APPLICATION NO. | : 11/906756 | |
| DATED | : September 11, 2012 | |
| INVENTOR(S) | : Peter Gillingham et al. | |

It is certified that error appears in the above-identified patent and that said Letters Patent is hereby corrected as shown below:

Title Page insert item (30)
    -- (30) Foreign Application Priority Data
        July 27, 1998 (CA)........................................2243892 --

Signed and Sealed this
Thirteenth Day of August, 2013

Teresa Stanek Rea
*Acting Director of the United States Patent and Trademark Office*